United States Patent
Beyhs et al.

(10) Patent No.: US 12,399,582 B2
(45) Date of Patent: Aug. 26, 2025

(54) RING INPUT DEVICE WITH VARIABLE ROTATIONAL RESISTANCE

(71) Applicant: Apple Inc., Cupertino, CA (US)

(72) Inventors: Michael Beyhs, Pfaffenheck (DE); Richard G. Huizar, San Marcos, CA (US); Filip Ilievski, Belmont, CA (US); Jean Hsiang-Chun Lu, Sunnyvale, CA (US); Thayne M. Miller, Escondido, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/353,044

(22) Filed: Jul. 14, 2023

(65) Prior Publication Data
US 2023/0359291 A1 Nov. 9, 2023

Related U.S. Application Data

(63) Continuation of application No. 17/471,024, filed on Sep. 9, 2021, now Pat. No. 11,733,790.
(Continued)

(51) Int. Cl.
| | |
|---|---|
| *G06F 3/0362* | (2013.01) |
| *G01D 5/24* | (2006.01) |
| *G06F 3/038* | (2013.01) |

(52) U.S. Cl.
CPC ........... *G06F 3/0362* (2013.01); *G01D 5/24* (2013.01); *G06F 3/038* (2013.01); *G06F 2203/0384* (2013.01)

(58) Field of Classification Search
CPC ............... G06F 3/0362; G06F 3/038; G06F 2203/0384; G01D 5/24
See application file for complete search history.

(56) References Cited

U.S. PATENT DOCUMENTS

| 8,570,273 B1 * | 10/2013 | Smith ................ G06F 3/03547 |
| | | 345/161 |
| 10,139,906 B1 | 11/2018 | Bai |

(Continued)

FOREIGN PATENT DOCUMENTS

| CN | 101785046 A | 7/2010 |
| CN | 103221901 | 7/2013 |

(Continued)

OTHER PUBLICATIONS

Advisory Action received for U.S. Appl. No. 17/471,024, mailed on Dec. 16, 2022, 3 pages.

(Continued)

*Primary Examiner* — Ariel A Balaoing
(74) *Attorney, Agent, or Firm* — Kubota & Basol LLP

(57) ABSTRACT

A ring input device, and more particularly to variable rotational resistance mechanisms within the ring input device that modulate the rotational friction of a rotating outer band to improve the user experience, is disclosed. Because finger rings are often small and routinely worn, electronic finger rings can be employed as unobtrusive communication devices that are readily available to communicate wirelessly with other devices capable of receiving those communications. Ring input devices according to examples of the disclosure can modulate the rotational friction of its rotating outer band in accordance with an item (e.g., user interface or parameter) being manipulated by the band.

20 Claims, 16 Drawing Sheets

Related U.S. Application Data

(60) Provisional application No. 63/083,084, filed on Sep. 24, 2020, provisional application No. 63/083,088, filed on Sep. 24, 2020, provisional application No. 63/083,082, filed on Sep. 24, 2020, provisional application No. 63/083,092, filed on Sep. 24, 2020.

(56) References Cited

U.S. PATENT DOCUMENTS

| | | | |
|---|---|---|---|
| 10,317,940 | B2 | 6/2019 | Eim et al. |
| 10,635,173 | B2 | 4/2020 | Lim et al. |
| 2002/0067160 | A1* | 6/2002 | Oomkes .............. H01H 5/02 324/207.2 |
| 2003/0214481 | A1 | 11/2003 | Xiong |
| 2005/0237214 | A1* | 10/2005 | Sanchirico, Jr. ...... E05B 65/108 70/333 R |
| 2006/0001646 | A1 | 1/2006 | Hai |
| 2006/0033703 | A1* | 2/2006 | Olien .................. G06F 3/0362 345/156 |
| 2007/0164733 | A1 | 7/2007 | Kabashima et al. |
| 2007/0268268 | A1 | 11/2007 | Allison |
| 2007/0279401 | A1* | 12/2007 | Ramstein ............. G06F 3/016 345/184 |
| 2010/0164908 | A1* | 7/2010 | Hill .................... G06F 3/0362 345/184 |
| 2011/0007035 | A1* | 1/2011 | Shai ................... G06F 3/0304 345/179 |
| 2012/0075173 | A1* | 3/2012 | Ashbrook ............ G06F 3/0362 345/156 |
| 2012/0293410 | A1 | 11/2012 | Bell |
| 2013/0027341 | A1 | 1/2013 | Mastandrea |
| 2013/0135223 | A1 | 5/2013 | Shai |
| 2015/0208967 | A1 | 7/2015 | Tateda et al. |
| 2016/0378131 | A1* | 12/2016 | Battlogg ............ F16H 59/0217 74/553 |
| 2016/0378184 | A1 | 12/2016 | Dow et al. |
| 2017/0045958 | A1* | 2/2017 | Battlogg ............... G06F 1/169 |
| 2017/0108939 | A1 | 4/2017 | Chilmulwar et al. |
| 2017/0147138 | A1* | 5/2017 | Dow ..................... G06F 1/163 |
| 2017/0262083 | A1* | 9/2017 | Huang .................. G06F 3/016 |
| 2018/0018026 | A1* | 1/2018 | Bushnell ............. G06F 3/0362 |
| 2018/0052517 | A1 | 2/2018 | Bulgarelli et al. |
| 2018/0120891 | A1* | 5/2018 | Eim .................... H04M 1/0235 |
| 2018/0193198 | A1 | 7/2018 | Li et al. |
| 2018/0210562 | A1* | 7/2018 | Kao .................... G06F 3/0362 |
| 2018/0239429 | A1 | 8/2018 | Gupta et al. |
| 2019/0015014 | A1 | 1/2019 | Lange |
| 2019/0038222 | A1 | 2/2019 | Krimon et al. |
| 2019/0155385 | A1 | 5/2019 | Lim et al. |
| 2019/0187751 | A1 | 6/2019 | Griffin |
| 2019/0346941 | A1 | 11/2019 | Griffin et al. |
| 2020/0004346 | A1* | 1/2020 | Vlasov ............... G06F 3/03543 |
| 2020/0142497 | A1 | 5/2020 | Zhu et al. |
| 2020/0178395 | A1 | 6/2020 | Graber et al. |
| 2020/0403470 | A1* | 12/2020 | Tzeng ................ H02K 7/1861 |
| 2021/0096660 | A1 | 4/2021 | Xie et al. |
| 2021/0286448 | A1* | 9/2021 | Dunant ............... G06F 3/0362 |
| 2022/0091683 | A1 | 3/2022 | Beyhs et al. |
| 2022/0300026 | A1* | 9/2022 | Alzingre ............. G05G 9/047 |
| 2023/0341956 | A1* | 10/2023 | Rizvi .................. G06F 3/0362 |

FOREIGN PATENT DOCUMENTS

| | | |
|---|---|---|
| CN | 103221902 A | 7/2013 |
| CN | 105004464 A | 10/2015 |
| CN | 106164808 A | 11/2016 |
| CN | 106473725 A | 3/2017 |
| WO | 2015/102175 A1 | 7/2015 |
| WO | 2018/030887 A1 | 2/2018 |

OTHER PUBLICATIONS

Final Office Action received for U.S. Appl. No. 16/834,888, mailed on Aug. 18, 2021, 25 pages.

Final Office Action received for U.S. Appl. No. 17/471,024, mailed on Nov. 4, 2022, 14 pages.

International Search Report received for PCT Patent Application No. PCT/US2020/040102, mailed on Sep. 24, 2020, 4 pages.

Non-Final Office Action received for U.S. Appl. No. 16/834,888, mailed on Jan. 22, 2021, 25 pages.

Non-Final Office Action Received for U.S. Appl. No. 17/471,024, mailed on Jun. 6, 2022, 12 Pages.

Notice of Allowance received for U.S. Appl. No. 16/834,888, mailed on Nov. 8, 2021, 13 pages.

Notice of Allowance received for U.S. Appl. No. 17/471,024, mailed on Apr. 5, 2023, 7 pages.

AMS Datasheet, "TMG3992", Gesture, Color, ALS, and Proximity Sensor Module with mobeam (TM) Barcode Emulation, V1-06, Feb. 27, 2018, 95 pages.

AMS Datasheet, "TMG49037", Gesture, Color and Proximity Sensor Module, v1-01, Aug. 20, 2019, 78 pages.

Han et al., "Frictio: Passive Kinesthetic Force Feedback for Smart Ring Output", Association for Computing Machinery, Oct. 22-25, 2017, 12 pages.

Nordic Semiconductor, "nRF52832", Multiprotocol Bluetooth 5, ANT/ANT+ and 2.4GHz Proprietary System-on-Chip, Product Brief Version 2.0, Retrieved on Apr. 4, 2019, 2 pages.

Tsukada et al., "Ubi-Finger: Gesture Input Device for Mobile Use", Information Processing Society of Japan, Jan. 2002, 8 pages.

Search Report received for Chinese Patent Application No. 202111118785.9, mailed on Mar. 21, 2024, 4 pages (2 pages of English Translation and 2 pages of Official Copy).

Search Report received for Chinese Patent Application No. 202111119256.0, mailed on Mar. 27, 2024, 4 pages (2 pages of English Translation and 2 pages of Official Copy).

\* cited by examiner

RING INPUT DEVICE WITH VARIABLE ROTATIONAL RESISTANCE

CROSS-REFERENCE TO RELATED APPLICATIONS

This application is a continuation of U.S. patent application Ser. No. 17/471,024, filed Sep. 9, 2021, and published on Mar. 24, 2022 as U.S. Publication No. 2022-0091683, which claims the benefit of U.S. Provisional Application No. 63/083,082, filed Sep. 24, 2020, U.S. Provisional Application No. 63/083,084, filed Sep. 24, 2020, U.S. Provisional Application No. 63/083,092, filed Sep. 24, 2020, and U.S. Provisional Application No. 63/083,088, filed Sep. 24, 2020, the contents of which are incorporated herein by reference in their entireties for all purposes.

FIELD

This relates to a ring input device, and more particularly to variable rotational resistance mechanisms within the ring input device that modulate the rotational friction of a rotating outer band to improve the user experience.

BACKGROUND

Many types of electronic devices are presently available that are capable of receiving input to initiate operations. Examples of such devices include desktop, laptop and tablet computing devices, smartphones, media players, wearables such as watches and health monitoring devices, smart home control and entertainment devices, headphones and ear buds, and devices for computer-generated environments such as augmented reality, mixed reality, or virtual reality environments. Many of these devices can receive input through the physical touching of buttons or keys, mice, trackballs, joysticks, touch panels, touch screens and the like. Some devices can also detect and receive input from objects such as a finger or stylus in close proximity to, but not physically touching, the device. To provide the convenience of being able to receive input at greater distances without having to be in close proximity to an object, many of these devices can also communicate wirelessly with other electronic devices, for example via Bluetooth or Wifi.

SUMMARY

This relates to a ring input device, and more particularly to variable rotational resistance mechanisms within the ring input device that modulate the rotational friction of a rotating outer band to improve the user experience. Because finger rings are often small and routinely worn, electronic finger rings can be employed as unobtrusive communication devices that are readily available to communicate wirelessly with other devices capable of receiving those communications. Ring input devices according to examples of the disclosure can modulate the rotational friction of its rotating outer band in accordance with an item (e.g., user interface or parameter) being manipulated by the band. Although ring input devices may be primarily described and illustrated herein as electronic finger rings for convenience of explanation, it should be understood that the examples of the disclosure are not so limited, but also include ring input devices that are worn as part of a necklace, hoop earrings, electronic bracelet bands that are worn around the wrist, electronic toe rings, and the like.

DETAILED DESCRIPTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Examples of the disclosure relate to a ring input device. Because finger rings are routinely worn and are often small, electronic finger rings can be employed as unobtrusive, everyday communication devices that are readily available to communicate wirelessly with other devices capable of receiving those communications. Although ring input devices may be primarily described and illustrated herein as electronic finger rings for convenience of explanation, it should be understood that the examples of the disclosure are not so limited, but also include ring input devices that are worn as part of a necklace, hoop earrings, electronic bracelet bands that are worn around the wrist, electronic toe rings, and the like. Some examples of the disclosure are directed to pressure-sensitive input mechanisms (e.g., buttons) within the ring input device that detect pressure to initiate an operation. Other examples of the disclosure are directed to a conductive outer band on the ring input device that can detect a touch to initiate an operation. Still other examples of the disclosure are directed to modulating the rotational friction of a rotating outer band on the ring input device to improve the user experience. Still other examples of the disclosure are directed to detecting the rotational position of the rotating outer band or detecting the position/orientation of the ring input device to provide additional input capabilities.

Figure 1A:
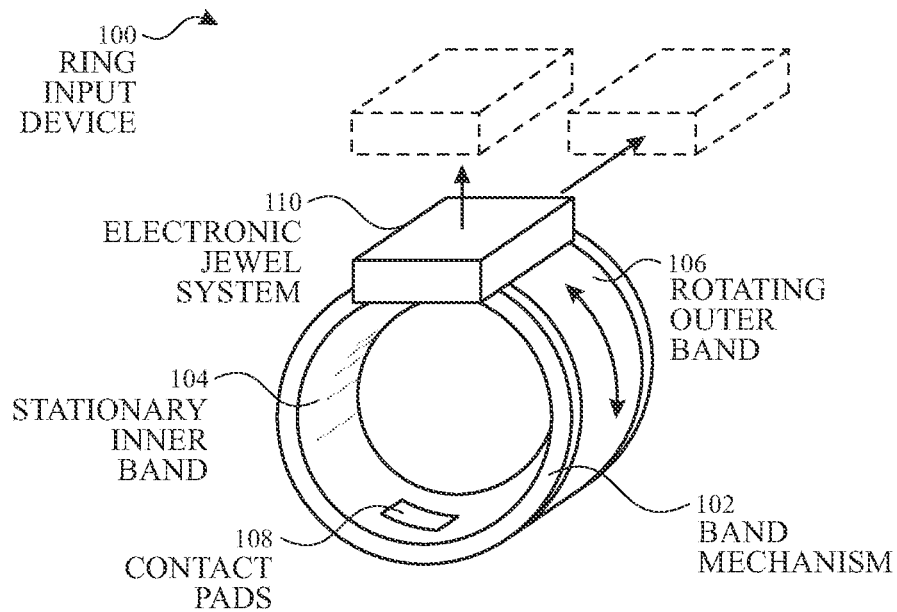
FIGS. 1A-1C illustrate different configurations of a ring input device according to examples of the disclosure.
Figure 1B:
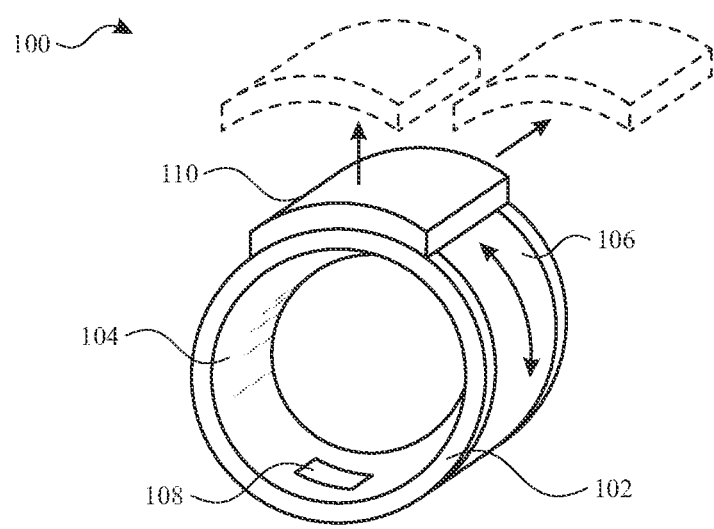
Figure 1C:
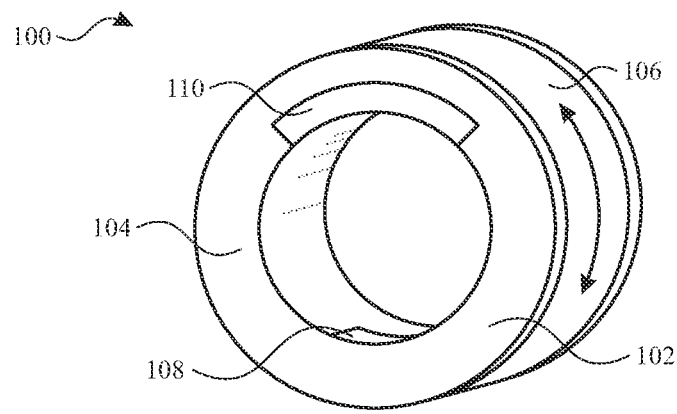

FIGS. 1A-1C illustrate different configurations of ring input device 100 according to examples of the disclosure. In the example of FIG. 1A, ring input device 100 can include band mechanism 102 that can include stationary inner band 104, rotating outer band 106, and contact pads 108 (for making electrical contact with a user's finger, for example). Band mechanism 102 can, in some examples, be removably couplable to an electronic jewel system which may be simply referred to herein as "jewel" 110, which is illustrated symbolically in FIG. 1A as a box, though in various examples in can be productized in a variety of different shapes and sizes. FIG. 1B illustrates ring input device 100 having a more compact, less obtrusive configuration of jewel 110 according to examples of the disclosure. To accommodate a flatter jewel 110 as in FIG. 1B, band mechanism 102 may be widened as compared to FIG. 1A (8 mm instead of 4 mm, for example). FIG. 1C illustrates ring input device 100 with the functionality of jewel 110 located inside a portion of a thickened stationary inner band 104. It should be understood that the illustrations of FIGS. 1A-1C are example configurations that are not drawn to scale, and that any of the components of FIGS. 1A-1C can take on different shapes, sizes and thicknesses.

Ring input device 100 of FIGS. 1A-1C can be utilized to provide wireless inputs for a wide variety of devices. For example, ring input device 100 can be used to provide inputs to companion wearable devices such as smart watches, health monitoring devices, headphones, ear buds and the like. Ring input device 100 can also be used to provide inputs to handheld devices such as smartphones (e.g., scrolling through a list using rotating outer band 106), tablet and laptop computing devices, media players, styluses, wands or gloves for computer-generated environments, and the like. In addition, ring input device 100 can also be used to provide inputs to stationary devices such as desktop computers, smart home control and entertainment devices (e.g., turning on a lamp, changing a TV channel), and the like. In some examples, ring input device 100 can receive wireless input from a companion device and provide information to the wearer of the ring (e.g., the ring can receive a notification from a smartphone and generate a vibrating alert).

Figure 1D:
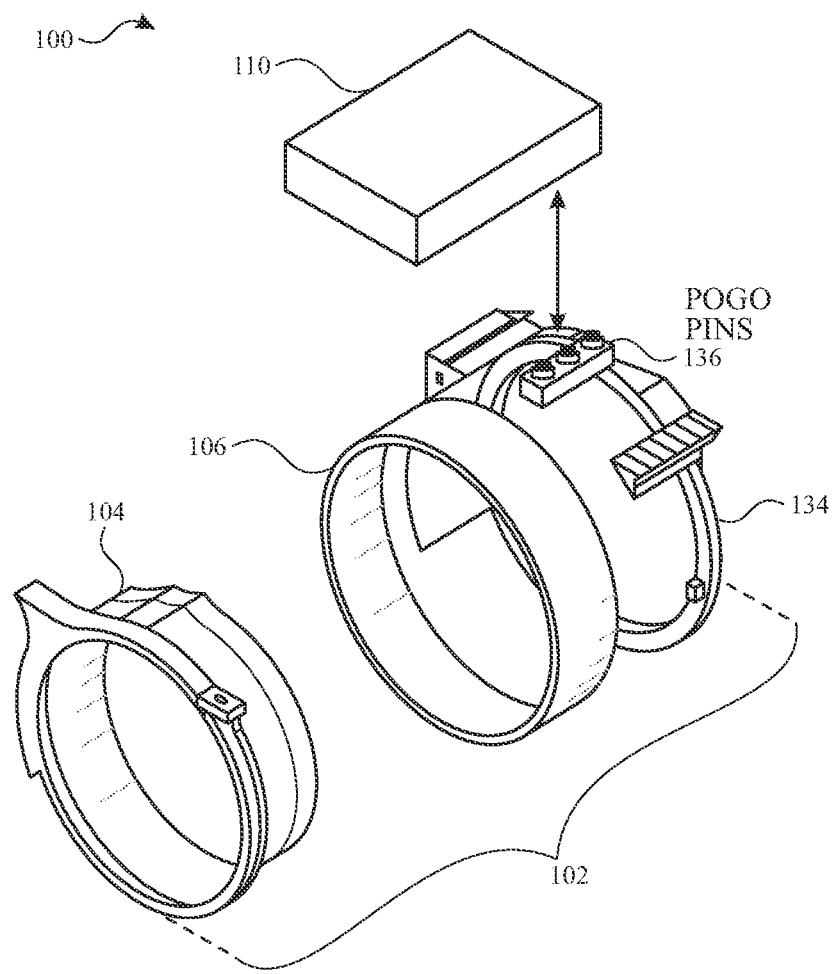
FIG. 1D is an exploded view of a ring input device according to examples of the disclosure.

FIG. 1D is an exploded view of ring input device 100 according to examples of the disclosure. In the example of FIG. 1D, band mechanism 102 is illustrated exploded in the axial direction, exposing example stationary inner band 104 and rotating outer band 106. Also shown is guard rail 134, which can couple to stationary inner band 104 to retain rotating outer band 106 while allow rotation of the outer band. Guard rail 134 can also include pogo pins 136 (described in further detail below) for providing electrical connections with jewel 110, although connections other than pogo pins 136 can also be employed. In some examples, and in some instances depending on the configuration of pogo pins 136 (or connections, in general), jewel 110 can be removably coupled to guard rail 134 using screws, tabs, tongue-and-groove structures, and the like. FIGS. 1A-1C illustrate (in dashed lines) that jewel 110 can, in various examples, be removed or installed vertically, or slid in and out horizontally.

Figure 2:
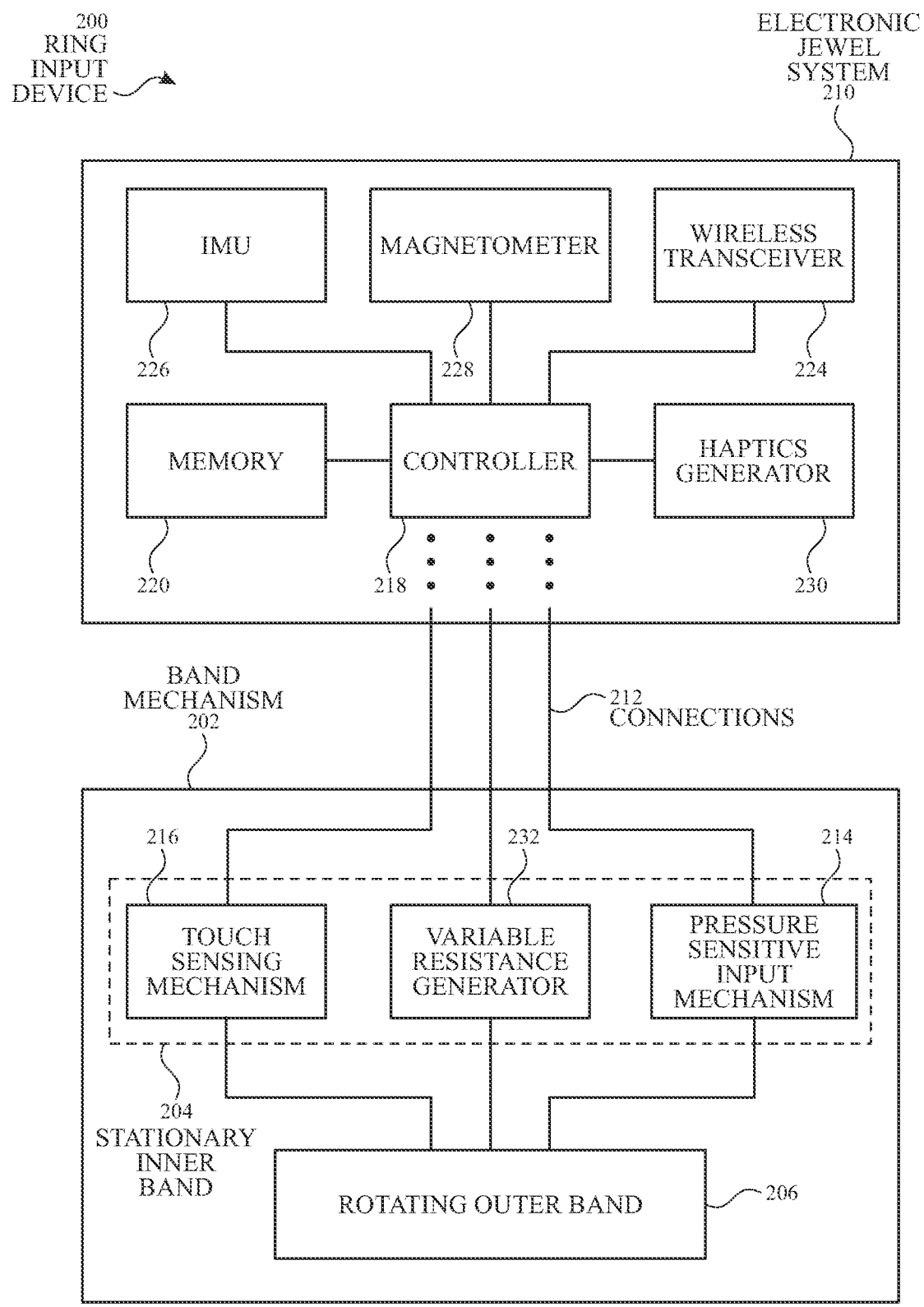
FIG. 2 is a system block diagram of a ring input device according to examples of the disclosure.

FIG. 2 is a system block diagram of ring input device 200 according to examples of the disclosure. In the example of FIG. 2, band mechanism 202 can be electrically coupled to jewel 210 through connections 212, which in some examples can be so-called "pogo pins," which are spring-loaded electrical connectors that press into, and make electrical contact with, conductive areas (lands or targets). Band mechanism 202 can include stationary inner band 204 and rotating outer band 206. In some examples, stationary inner band 204 can include pressure sensitive input mechanism 214 and touch sensing mechanism 216, although in other examples these blocks can be combined into one functional block. Stationary inner band 204 can also include variable resistance generator 232. In some examples, pressure sensitive input mechanism 214 and touch sensing mechanism can be electrically coupled to rotating outer band 206 via a sliding connection, and variable resistance generator 232 can apply a frictional or magnetic influence on rotating outer band 206.

Electronic jewel system or "jewel" 210 can include controller 218 coupled to memory and/or storage 220. Controller 218 can include one or more processors capable of executing programs stored in memory 220 to perform various functions. In examples of the disclosure, controller 218 can be connected to wireless transmitter or transceiver 224 and one or more of inertial measurement unit (IMU) 226, magnetometer 228, and haptics generator 230. Memory 220 can include, but is not limited to, random access memory (RAM) or other types of memory or storage, watchdog timers and the like. Controller 218 can include, but is not limited to, touch sensing circuitry for driving and/or sensing one or more touch electrodes, including the generation of one or more stimulation signals at various frequencies and/or phases that can be selectively applied to the touch electrodes. Controller 218 can also be communicatively coupled to magnetometer 228 to process signals from the magnetometer to determine the amount of rotation of rotating outer band 206, and to IMU 226 to process signals from the IMU to determine parameters such as the angular rate, orientation, position, and velocity of ring input device 200. In some examples, controller 218 can be communicatively coupled to haptics generator 230 to initiate haptic feedback. Controller 218 can also be communicatively coupled to wireless transmitter or transceiver 224 to send inputs wirelessly, and in some examples to send and receive data and other information. In some examples, wireless transmitter or transceiver 224 can communicate wirelessly with desktop, laptop and tablet computing devices, smartphones, media players, wearables such as watches and health monitoring devices, smart home control and entertainment devices, headphones and ear buds, and devices for computer-generated environments such as augmented reality, mixed reality, or virtual reality environments, and the like.

It should be apparent that the architecture shown in FIG. 2 is only one example architecture of jewel 210, and that the system could have more or fewer components than shown, or a different configuration of components. The various components shown in FIG. 2 can be implemented in hardware, software, firmware or any combination thereof, including one or more signal processing and/or application specific integrated circuits.

Note that one or more of the functions described herein can be performed by firmware stored in memory 220 and executed by a processor in controller 218. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. In some examples, memory 220 can be a non-transitory computer readable storage medium. Memory 220 can have stored therein instructions, which when executed by a processor in controller 218, can cause ring input device 200 to perform one or more functions and methods of one or more examples of this disclosure. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Figure 3A:
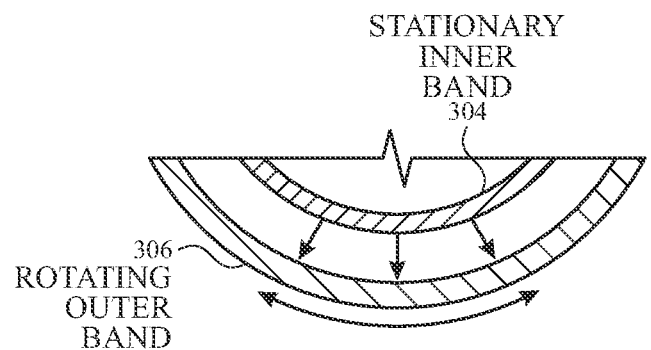
FIG. 3A is a symbolic side view of a portion of a stationary inner band and a rotating outer band according to examples of the disclosure.

FIG. 3A is a symbolic side view of a portion of stationary inner band 304 and rotating outer band 306 according to examples of the disclosure. It should be noted that FIG. 3A is not drawn to scale, and that the gap between stationary inner band 304 and rotating outer band 306 can be on the order of several hundred microns. In some examples, an encoder (e.g., an optical encoder) can be used to detect the rotation of outer band 306, though in other examples described hereinbelow, other devices such as a magnetometer can be used. As described above, stationary inner band 304 can include a variable resistance generator, which can apply a frictional or magnetic influence on rotating outer band 306 to effectively produce a feeling of modulated resistance to the rotation of the outer band. In the example of FIG. 3A, arrows are shown that symbolically represent the frictional or magnetic influence that can be applied to rotating outer band 306. In some examples, this frictional or magnetic influence can be the result of an effective increase in the diameter of stationary inner band 304, at least in portions of the inner band. In examples of the disclosure, this frictional or magnetic influence can be modulated so that rotating outer band 306 can become easier or harder to rotate, be frozen in place, produce the feeling of detents (bumps, catches, etc.) on the band, produce hard stops, and the like.

Modulating the rotational resistance of rotating outer band 306 can provide a number of advantages. In general, a user interface being manipulated by the ring input device can affect the rotational resistance of outer band 306 to improve the user experience. For example, rotation of outer band 306 can become more difficult and eventually stop at the end of an input (e.g., when the rotation causes the end of a virtually displayed slider to be reached). In some examples, the frictional or magnetic influence can depend on the item (e.g., the parameter or user interface (UI)) being manipulated. In other examples, rotational resistance can be reduced when a list to be scrolled is long and fast scrolling is desired, or the rotational resistance can be increased when the list is short or when more precise scrolling is desired. In still other examples, rotational resistance can be increased or decreased depending on whether the item being manipulated should be changed slowly (e.g., the volume of a companion device) or quickly (e.g., scrolling through a lengthy document).

The feeling of detents, caused by pulses of increased rotational resistance, can be advantageous when moving through a document in page view, moving in discrete increments, jumping from one icon to another, etc. However, because detents can be time sensitive, delays in receiving detents can render the feedback useless, or worse, lead to errors. Delays can be the result of the round-trip communication path of receiving an input at outer band 306, wirelessly transmitting a signal to a companion device, receiving a reply from the companion device, and then generating the detent. Thus, in some examples, detent processing and generation can be handled locally, such as within the jewel.

In other examples, strong rotational resistance, to the point of making rotating outer band 306 immobile, can be employed to ensure that no rotational inputs are inadvertently generated. In addition, strong rotational resistance can be applied only at the beginning of a rotation, and can be reduced as the user applies enough rotational force to overcome this strong initial rotational resistance. This strong initial rotational resistance can feel like the initial resistance of a switch being flipped on or a knob being clicked on, and can ensure that no events are accidentally triggered. Similarly, strong rotational resistance can be applied only at the end of a rotation, and can be increased to require that the user apply enough rotational force to overcome this strong terminal rotational resistance. This strong terminal rotational resistance can feel like the final end resistance of a switch being flipped off or a knob being clicked off, requiring a strong affirmative action to end the activity. It should be understood that the preceding description of uses is non-limiting and merely illustrative, and that modulating the rotational resistance of rotating outer band 306 is contemplated for other purposes as well.

Figure 3B:
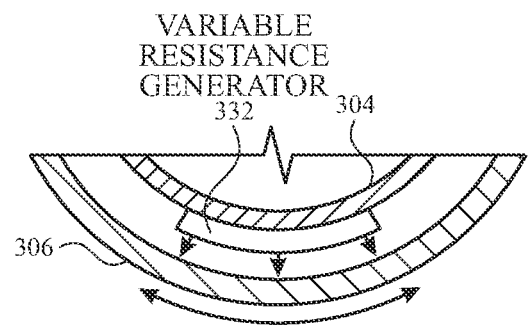
FIG. 3B illustrates a side symbolic view of a portion of a stationary inner band and a rotating outer band with a variable resistance generator supported on the inner band according to examples of the disclosure.

FIG. 3B illustrates a side symbolic view of a portion of stationary inner band 304 and rotating outer band 306 with variable resistance generator 332 supported on the inner band according to examples of the disclosure. In some examples of the disclosure, variable resistance generator 332 can be an electroactive polymer (EAP) which can change size and shape when stimulated by an electric field. The strength of the applied electric field can determine the amount of applied resistance to rotating outer band 306, and pulsing the applied electric field at a particular duty cycle can create the feeling of detents in the rotating outer band. In some examples, variable resistance generator 332 can be an electromechanical brake, where electromagnetic force is used to press the variable resistance generator (in this example, in the form of a brake pad) against rotating outer band 306. The strength of the applied electromagnetic force can determine the amount of applied resistance to rotating outer band 306, and pulsing the applied electromagnetic force at a particular duty cycle can create the feeling of detents in the rotating outer band. In some examples, variable resistance generator 332 can be a shape memory alloy (SMA) which can change size and shape depending on its temperature, as controlled by current flow. The current flow can determine the amount of applied resistance to rotating outer band 306, and pulsing the current at a particular duty cycle can create the feeling of detents in the rotating outer band. In some examples, variable resistance generator 332 can be an air bladder, which can change size and shape depending on its air (or other gas) content. The amount of air can determine the amount of applied resistance to rotating outer band 306, and pulsing the volume of air at a particular duty cycle can create the feeling of detents in the rotating outer band. In some examples, variable resistance generator 332 can be a piezoelectric material which can change size and shape when a voltage is applied. The voltage level can determine the amount of applied resistance to rotating outer band 306, and pulsing the voltage level at a particular duty cycle can create the feeling of detents in the rotating outer band. In some examples, variable resistance generator 332 can be an electroadhesive pad. The electroadhesive pad can include electrodes biased with alternating positive and negative voltages, creating an electric field therebetween. Positive and negative charges can then be induced on rotating outer band 306, which can cause electrostatic adhesion to develop between the electrodes and the outer band, creating rotational resistance between them.

Figure 3C:
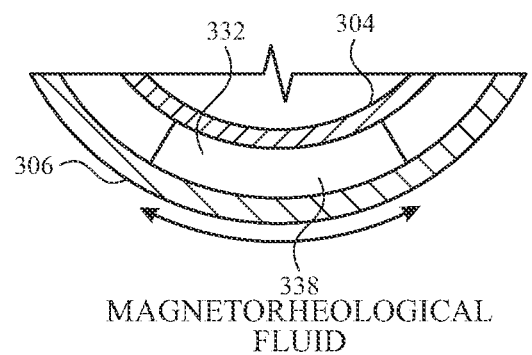
FIG. 3C illustrates a side symbolic view of a portion of a stationary inner band and a rotating outer band with a variable resistance generator containing magnetorheological fluid according to examples of the disclosure.

FIG. 3C illustrates a side symbolic view of a portion of stationary inner band 304 and rotating outer band 306 with variable resistance generator 332 containing magnetorheological fluid 338 according to examples of the disclosure. In the example of FIG. 3C, magnetorheological fluid 338 can be retained in a membrane or other receptacle to hold the fluid between stationary inner band 304 and rotating outer band 306. Because magnetorheological fluid 338 can increase in viscosity in the presence of a magnetic field to the point of effectively becoming a solid, the strength of the applied magnetic field can determine the viscosity and therefore the amount of applied resistance to rotating outer band 306, and pulsing the applied magnetic field at a particular duty cycle can create the feeling of detents in the rotating outer band.

Figure 3D:
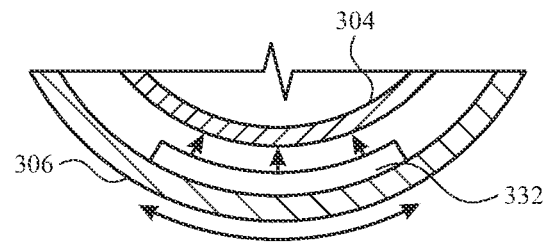
FIG. 3D illustrates a side symbolic view of a portion of a stationary inner band and a rotating outer band with a variable resistance generator supported on the outer band according to examples of the disclosure.

FIG. 3D illustrates a side symbolic view of a portion of stationary inner band 304 and rotating outer band 306 with variable resistance generator 332 supported on the outer band according to examples of the disclosure. The example of FIG. 3D is similar to the example of FIG. 3B, except that variable resistance generator is supported on rotating outer band 306. In the example of FIG. 3D, arrows are shown that symbolically represent the frictional or magnetic influence can be applied to stationary inner band 304. The various examples of variable resistance generator 332 described above in FIGS. 3A-3C can also be employed in FIG. 3D. In the example of FIG. 3D, one or more additional electrical connections are needed between stationary inner band 304 and rotating outer band 306 to apply electric fields, electromagnetic force, current flow and the like to variable resistance generator 332. In some examples, these connections can be made by leaf springs or other slidable contacts.

Figure 4A:
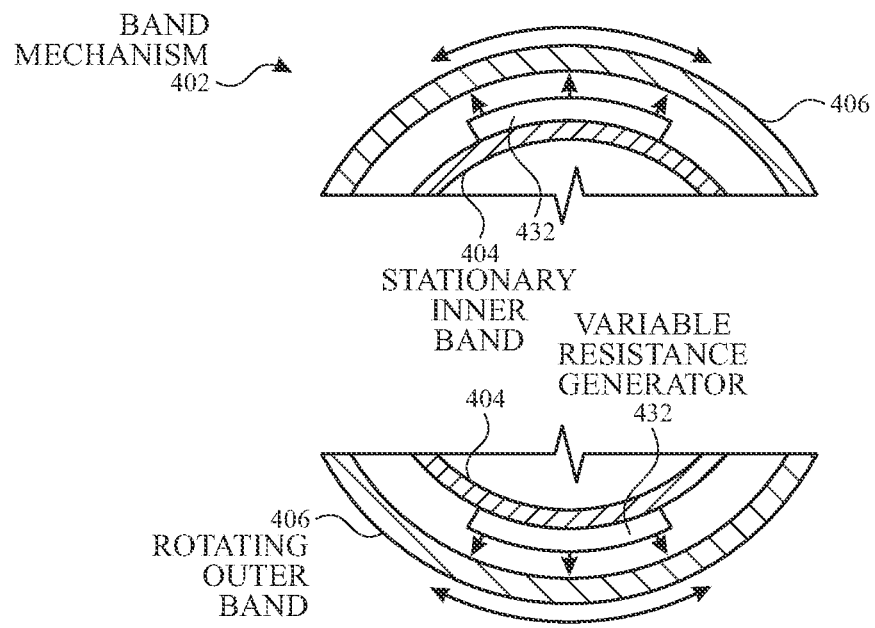
FIG. 4A is a symbolic side view of two portions of a stationary inner band and a rotating outer band in concentric alignment according to examples of the disclosure.

FIG. 4A is a symbolic side view of two portions of stationary inner band 404 and rotating outer band 406 in concentric alignment according to examples of the disclosure. In the examples of variable resistance generators 432 described above, if stationary inner band 404 and rotating outer band 406 are configured as concentric bands as in the example of FIG. 4A, variable resistance generators 432 can be required on opposing sides of band mechanism 402 to apply complementary opposing forces and maintain the concentric relationship of the inner and outer bands. It should be understood that although FIG. 4A only shows variable resistance generators 432 at bottom and top locations for ease of illustration, multiple variable resistance generators can be employed in any number of opposing locations along the band mechanism.

Figure 4B:
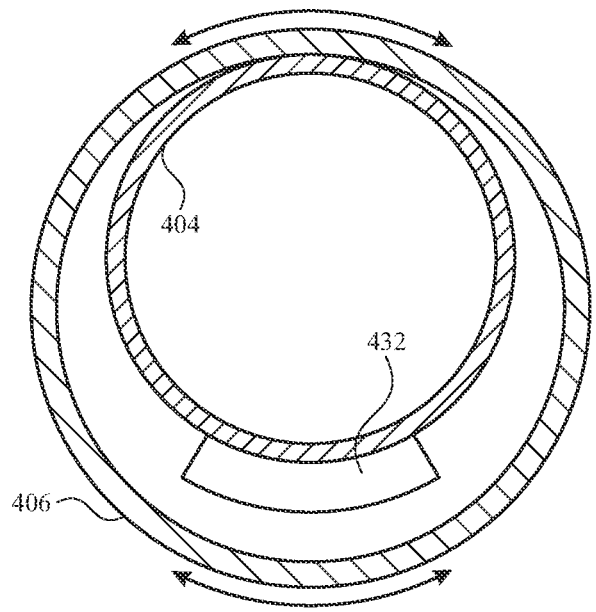
FIG. 4B is a symbolic side view of two portions of a stationary inner band and a rotating outer band in an eccentric relationship according to examples of the disclosure.

FIG. 4B is a symbolic side view of two portions of stationary inner band 404 and rotating outer band 406 in an eccentric relationship according to examples of the disclosure. In the examples of variable resistance generators 432 described above, if stationary inner band 404 and rotating outer band 406 are configured as eccentric bands as in the example of FIG. 4B, variable resistance generators 432 need not be required on opposing sides of band mechanism 402 to maintain the eccentric relationship of the inner and outer bands. It should be understood that although FIG. 4B only shows one variable resistance generator 432 at a bottom location for ease of illustration, multiple variable resistance generators can be employed in multiple locations along the band mechanism, although the geometry of the eccentric bands illustrated in FIG. 4B can limit the location of variable resistance generators, and the effective "diameter increase" of each variable resistance generator may need to be different, depending on the location of the variable resistance generator along the band mechanism.

Figure 5A:
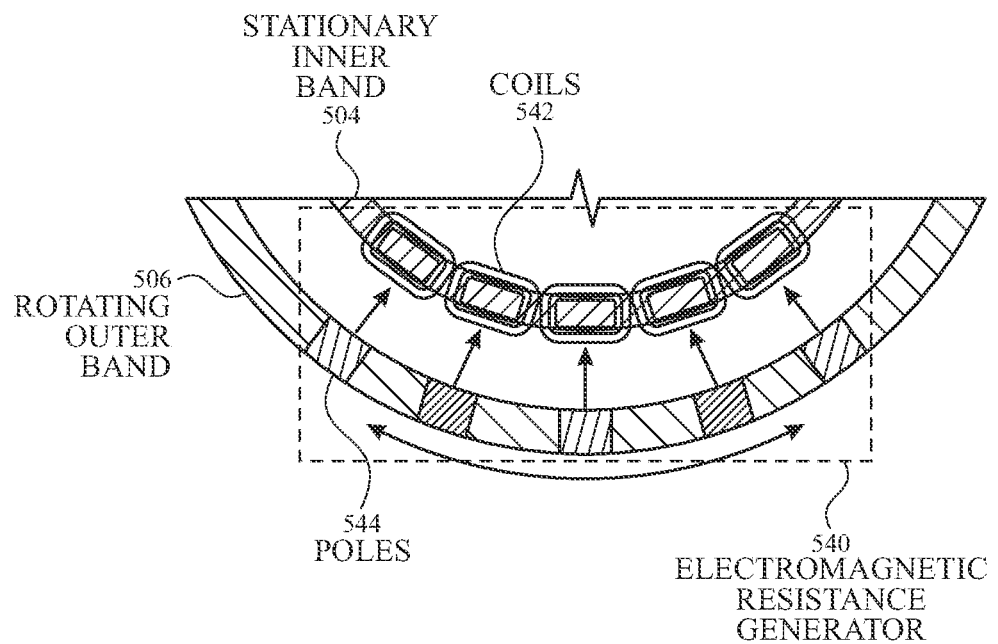
FIG. 5A is a symbolic side view of a portion of a stationary inner band and a rotating outer band with an electromagnetic rotational resistance generator according to examples of the disclosure.

FIG. 5A is a symbolic side view of a portion of stationary inner band 504 and rotating outer band 506 with electromagnetic rotational resistance generator 540 according to examples of the disclosure. In the example of FIG. 5A, electromagnetic rotational resistance generator 540 can include an array of coils 542 formed on stationary inner band 504 and an array of magnetic poles 544 formed on rotating outer band 506. Poles 544 can be formed to have alternating opposite poles (e.g., a sequence of north-south-north-south, etc. poles), although in other examples different patterns of opposite poles can be employed. In the example of FIG. 5A, the direction of current flow through each coil 542 can attract or repel the magnetized poles 544. In some examples, individual coils 542 can be magnetized via directional current flow in accordance with the magnetization pattern of poles 544 to create forces of attraction with respect to poles 544 (see arrows) sufficient to resist the rotation of rotating outer band 506, effectively creating a braking effect. The strength of the electromagnets formed by coils 542 can vary in accordance with their current flow to create a variable effective resistance. In some examples, the resistance to rotation that can be felt on rotating outer band 506 as a pole passes by the attractive forces of a coil can create a force profile that mimics the feeling of detents on the band mechanism. If the forces of attraction are strong enough, rotating outer band 506 can feel locked in place.

Figure 5B:
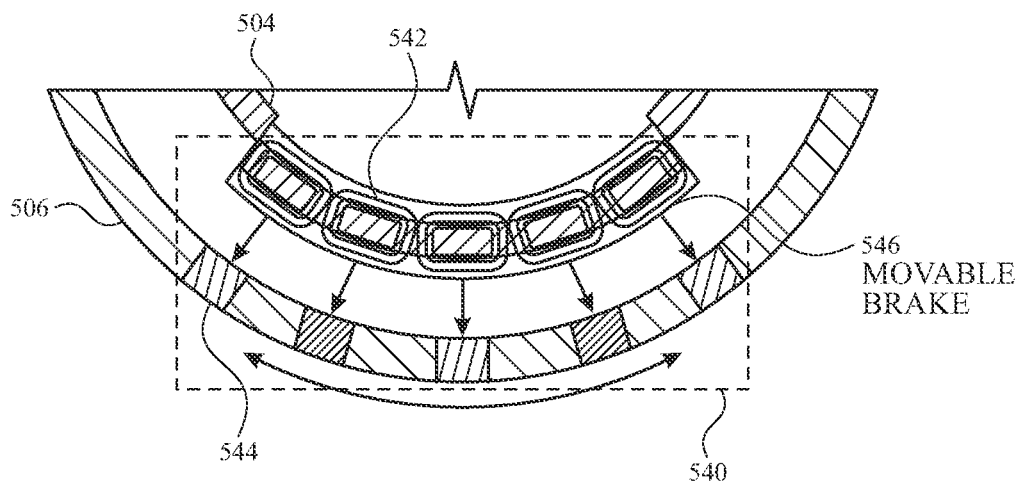
FIG. 5B is a symbolic side view of a portion of a stationary inner band and a rotating outer band with an electromagnetic rotational resistance generator having a movable brake according to examples of the disclosure.

FIG. 5B is a symbolic side view of a portion of stationary inner band 504 and rotating outer band 506 with electromagnetic rotational resistance generator 540 having movable brake 546 according to examples of the disclosure. In the example of FIG. 5B, magnetic rotational resistance generator 532 can include an array of coils 542 formed on brake 546 which can be movably coupled to stationary inner band 504, and an array of magnetic poles 544 formed on rotating outer band 506. In some examples, individual coils 542 can be magnetized via directional current flow in accordance with the magnetization pattern of poles 544 to create forces of attraction with respect to poles 544 sufficient to resist the rotation of rotating outer band 506. However, unlike the examples of FIG. 5A, coils 542 can be affixed to brake 546, which can move towards rotating outer band 506 until it contacts the outer band, providing resistance and effectively creating a braking effect. The strength of the electromagnets formed by coils 542, and therefore the movement of brake 546 and the amount of friction or resistance that is created with respect to rotating outer band 506 can vary in accordance with their current flow to create a variable effective resistance. If the resistance is strong enough, rotating outer band 506 can feel locked in place.

In other examples, individual coils 542 can be magnetized via directional current flow in various timing sequences to create rotational movement in rotating outer band 506 without requiring a user's touch. In other examples, manual rotation of rotating outer band 506, such as by a finger, can induce a current in coils 542. This energy can then be harvested and stored for later use, such as by charging a battery within the jewel.

Figure 6A:
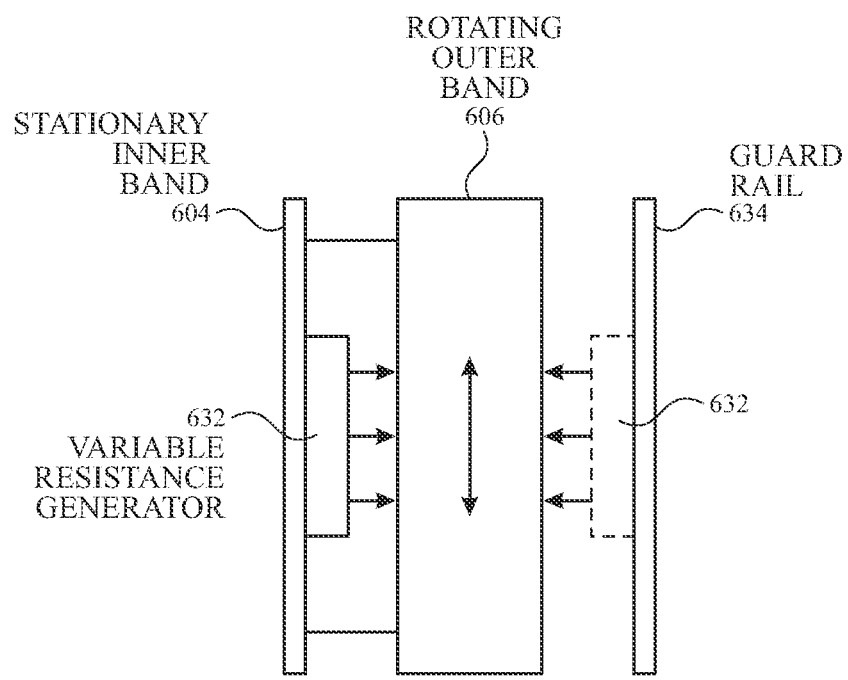
FIG. 6A is a symbolic end view of a stationary inner band, a rotating outer band, a guard rail and a variable resistance generator configured for axial resistance according to examples of the disclosure.

FIG. 6A is a symbolic end view of stationary inner band 604, rotating outer band 606, guard rail 634 and variable resistance generator 632 configured for axial resistance according to examples of the disclosure. Unlike the descriptions of variable resistance generators associated with FIG. 5A which apply variable resistance in a radial direction, variable resistance generator 632 in the example of FIG. 6A can be affixed to a side rail of stationary inner band 604 and apply a variable resistance in an axial direction to a side wall of rotating outer band 606. In some examples, variable resistance generator 632 can alternatively or additionally be affixed to guard rail 634 as shown in dashed lines in FIG. 6A. Any of the variable resistance generator examples described above can be used in the example of FIG. 6A.

Figure 6B:
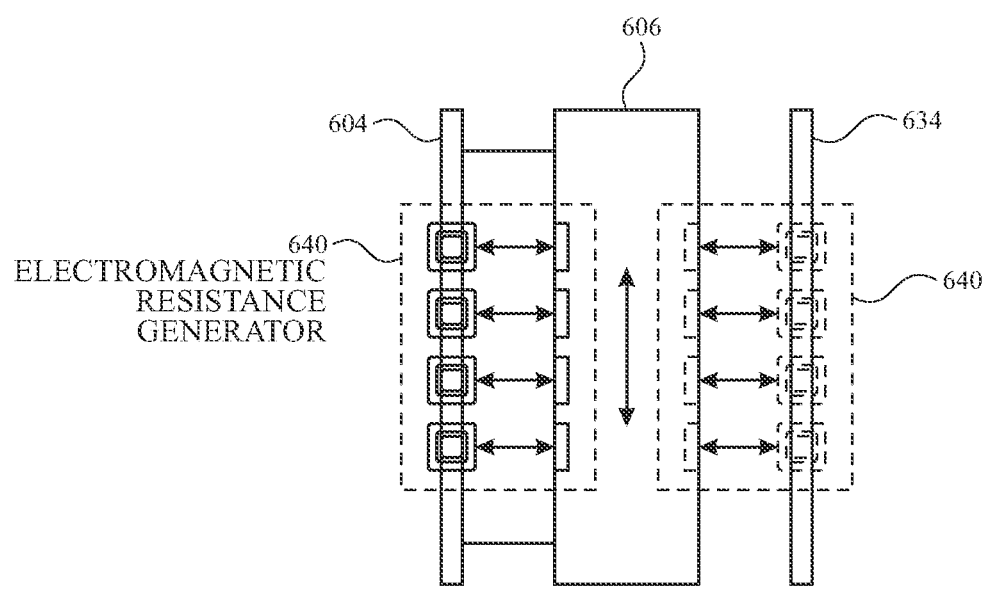
FIG. 6B is a symbolic end view of a stationary inner band, a rotating outer band, a guard rail and an electromagnetic resistance generator configured for axial electromagnetic force according to examples of the disclosure.

FIG. 6B is a symbolic end view of stationary inner band 604, rotating outer band 606, guard rail 634 and electromagnetic resistance generator 640 configured for axial electromagnetic force according to examples of the disclosure. Unlike the descriptions of electromagnetic resistance generators associated with FIG. 5B which apply electromagnetic force in a radial direction, electromagnetic resistance generator 640 in the example of FIG. 6B can be affixed to the side rails of stationary inner band 604 and side wall of rotating outer band 606 and produce electromagnetic forces of attraction and repulsion in an axial direction. In some examples, electromagnetic resistance generator 640 can alternatively or additionally be affixed to guard rail 634 and the opposing side wall of rotating outer band 606, as shown in dashed lines in FIG. 6B.

In addition to modulating the rotational resistance of rotating outer band 606 as described above, examples of the disclosure can also determine positional information such as the rotational position (e.g., the absolute angle of the rotation position) of the outer band. Determining the rotational position can provide a number of advantages. For example, rotation of outer band 606 from one determined rotational position to another can be used to compute a direction of rotation, an amount or angle of rotation, and the absolute position (e.g., a clockwise relative rotation of 15 degrees to an absolute 45 degree position). The direction, amount, and absolute position of rotation of outer band 606 can determine the direction and amount of scrolling through a list, the direction and amount of panning of an image, the direction and amount of cursor movement, and the direction and amount of change of a parameter being manipulated (e.g., the amount of volume change), to name just a few examples. In some examples, a series of rotations (e.g., a series of angles of rotation) can be recorded to recognize gestures and initiate certain actions. For example, a series of back-and-forth rotations between two locations (e.g., between the 4 o'clock and 6 o'clock positions) can be recognized as a gesture to initiate a particular operation (e.g., an erase operation). In other examples, the rotational position, captured over time, can be used to determine a velocity or acceleration of rotating outer band 606. It should be understood that the preceding description of uses is non-limiting and merely illustrative, and that determining the rotational position of outer band 606 is contemplated for other purposes as well. However, determining the rotational position can be difficult because rotating outer band 606 can freely move in either direction in an unlimited fashion (in the absence of applied rotational resistance), without any starting or ending points or other clear frame of reference.

Figure 7A:
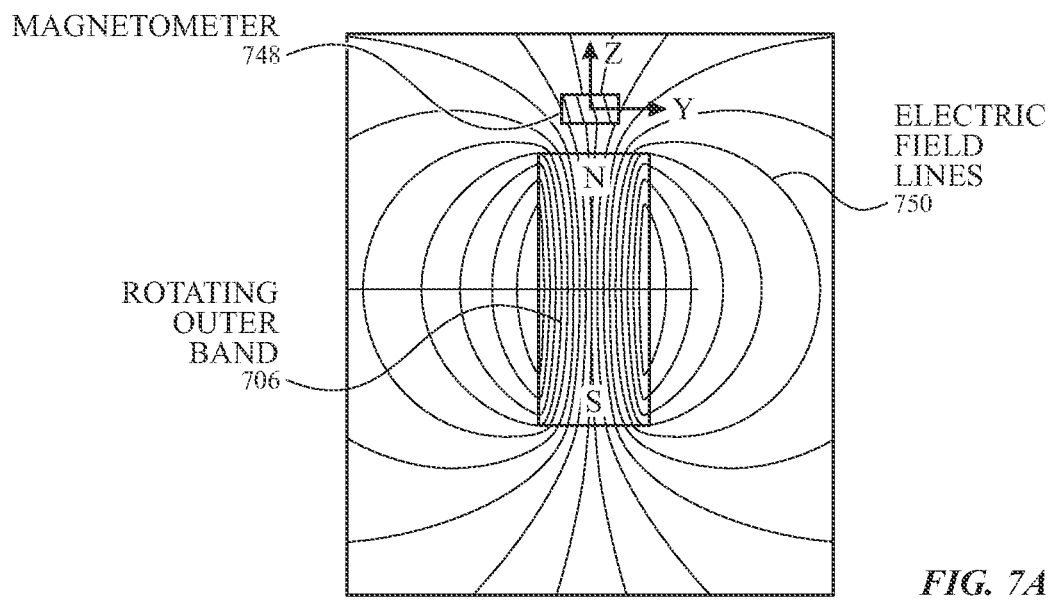
FIG. 7A is a symbolic end view of a rotating outer band and a magnetometer according to examples of the disclosure.

FIG. 7A is a symbolic end view of rotating outer band 706 and magnetometer 748 according to examples of the disclosure. In the example of FIG. 7A, rotating outer band 706 can be magnetized to form a single dipole, preferably with predictable and uniform magnetic field lines 750. In some examples, rotating outer band 707 can be made of a low coercivity, high remanence material to retain its magnetization. In some examples, 17-4 steel (approximately 17% chromium, 4% nickel) can be used, although other types of metal can also be employed. Magnetometer 748 can be located proximate to rotating outer band 706 in an area where magnetic field lines 750 from the outer band are present. In some examples, magnetometer 748 can be located in the jewel of the ring input device. Magnetometer 748 can be used to obtain rotational input data and measure and/or compute the direction, strength, or relative change of a magnetic field from its location. Because the location of magnetometer 748 acts as a point of reference from which calibrated measurements are obtained, precise placement of the magnetometer within the electric field is not required.

Figure 7B:
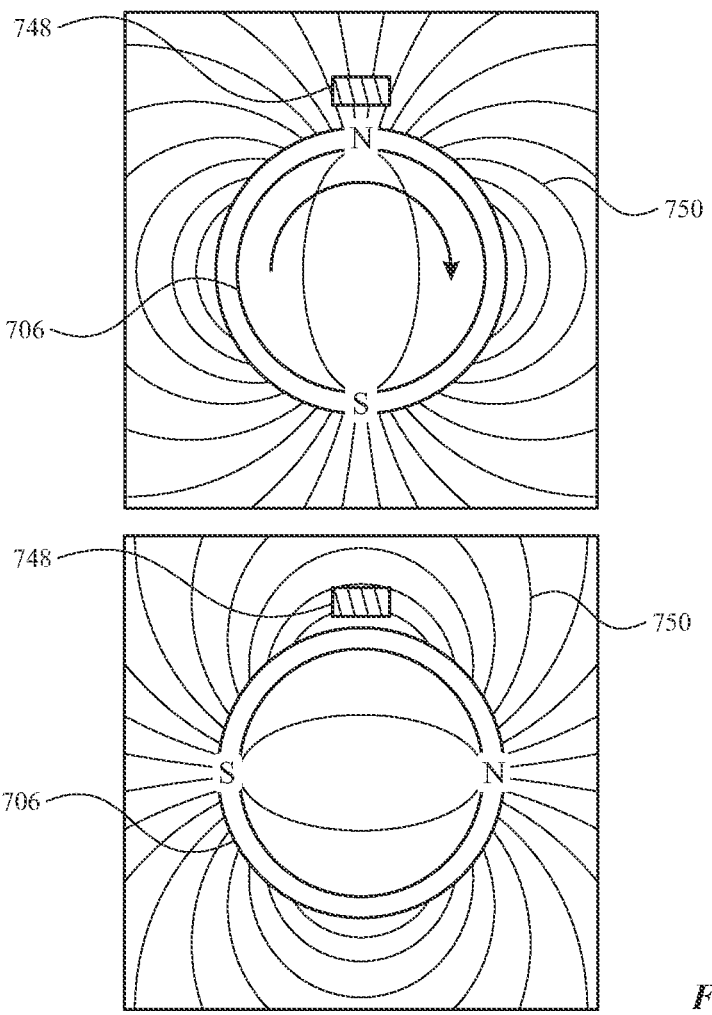
FIG. 7B illustrates two symbolic side views of a rotating outer band in two different positions, rotated 90 degrees from each other, and a magnetometer located in proximity to the outer band according to examples of the disclosure.

FIG. 7B illustrates two symbolic side views of rotating outer band 706 in two different positions, rotated 90 degrees from each other, and magnetometer 748 located in proximity to the outer band according to examples of the disclosure. In the upper view, rotating outer band 706 is oriented with its north pole (N) at the 12 o'clock position, and its south pole (S) at the 6 o'clock position. In the lower view, outer band 706 has been rotated clockwise by 90 degrees, so that N is at the 3 o'clock position and S is at the 9 o'clock position. Note that magnetic field lines 750 have also been rotated clockwise by 90 degrees, which changes the strength of the magnetic field in each axis. In some examples of the disclosure, magnetometer 748 can be a multiple axis magnetometer which can measure magnetic field strength in at least Y and Z orthogonal axes, and these measurements can thereafter be used to compute the rotational position of outer band 706 by comparing measurements of magnetic field strength at the original and rotated positions. Although FIGS. 7A-7B shows rotating outer band 706 magnetized to form a single dipole, in other examples the outer band can be magnetized to form multiple dipoles. While the single dipole example of FIG. 7A can provide the advantage of determining absolute rotational position, multiple dipoles can provide the advantage of higher spatial resolution, because each dipole can be used to obtain more precise rotational position information over a smaller rotational range (e.g., 0-90 degrees). However, multiple dipoles can make it more difficult to disambiguate magnetometer magnetic field strength measurements and compute absolute rotational position information.

Magnetometer 748 can be calibrated prior to computing the rotational position of rotating outer band 706. Calibration can be performed prior to delivery of the final product, or by a user, by rotating the outer band one or more times. During these rotations, magnetometer 748 can measure the magnetic field strength along the Y and Z axes, and the influence of the earth's magnetic field can be ignored, because it can be on the order of 1% of the magnetic field produced by the magnetized outer band. In some examples, these magnetic field strength values can then be normalized to values between −1.0 and +1.0, for example. However, if magnetometer 748 is to be calibrated to compensate for the earth's magnetic field, then the magnetometer may be required to measure the magnetic field strength along all three axes (X, Y and Z axes).

Figure 8A:
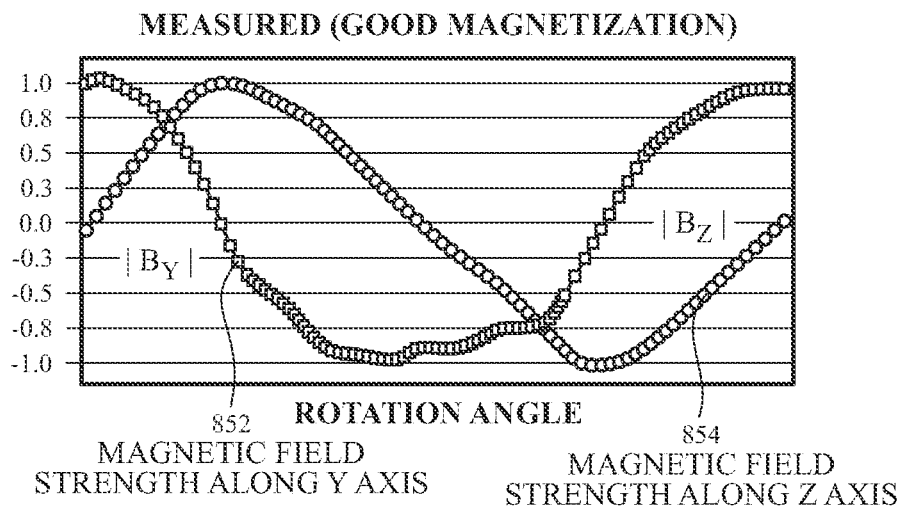
FIG. 8A is a normalized plot of rotation angle vs. magnetic field strength along the Y axis and along the Z axis according to one example of the disclosure.
Figure 8B:
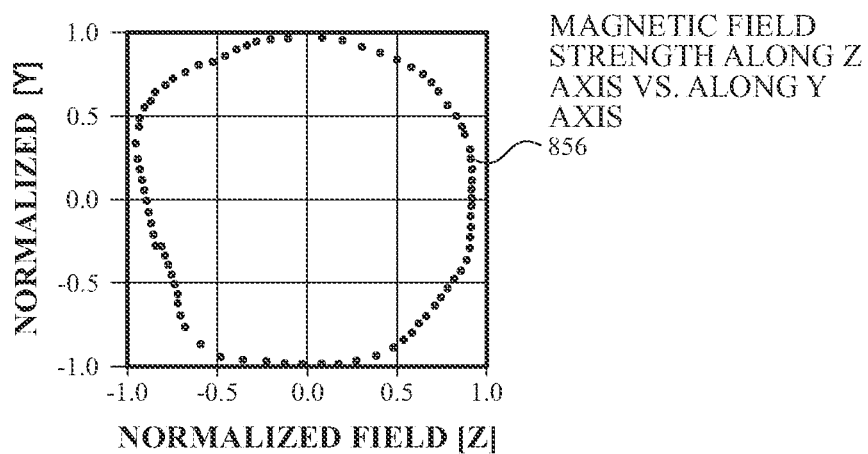
FIG. 8B is a normalized plot of magnetic field strength along the Z axis vs. magnetic field strength along the Y axis according to the example of FIG. 8A.

FIG. 8A is a normalized plot of rotation angle vs. magnetic field strength along the Y axis (plot 852) and along the Z axis (plot 854) according to one example of the disclosure. FIG. 8B is a normalized plot 856 of magnetic field strength along the Z axis vs. magnetic field strength along the Y axis according to the example of FIG. 8A. Ideally, the plot of FIG. 8B would be a circle with points at (0.0, 1.0), (1.0, 0.0), (0.0, −1.0), and (−1.0, 0.0) (clockwise from the 12 o'clock position), and the Y and Z plots of FIG. 8A would be more regular and sinusoidal in shape, but due to imperfect, non-uniform magnetization of the outer rotating band (which can result in less predictability in the magnetic field lines), the plots can be distorted, as shown in FIGS. 8A-8B.

Figure 8C:
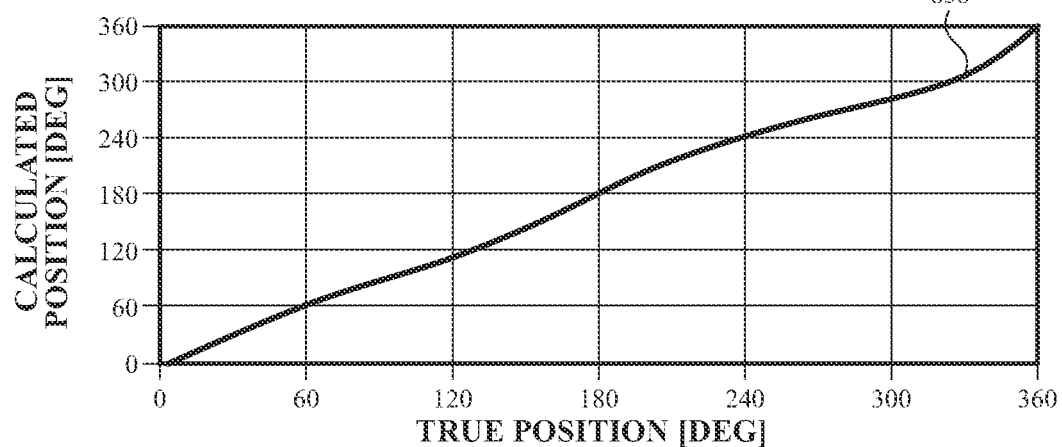
FIG. 8C is a plot of rotation angle true position (in degrees) vs. calculated position (in degrees) according to the example of FIGS. 8A-8B.

FIG. 8C is a plot 858 of rotation angle true position (in degrees) vs. calculated position (in degrees) according to the example of FIGS. 8A-8B. The calculated (absolute) position can be computed as θ=arctan 2 (Y,Z), where Y is the measured (normalized) magnetic field strength along the Y axis, and Z is the measured (normalized) magnetic field strength along the Z axis. Ideally, the plot of FIG. 8C would be linear, but due to imperfect magnetization the plot can contain some perturbations. In some examples of the disclosure, a calibration lookup table can be used to apply offsets to the calculated positions so that the resulting calibrated positions can produce a more linear plot than the plot shown in FIG. 8C. This calibration lookup table can be populated with offset values based on empirical data taken prior to the delivery of the final product, or it can be populated during field calibrations that are initiated by a user, or initiated periodically according to an automated calibration plan. In other examples, instead of a calibration lookup table, the offset values can be computed using piecewise estimates or using a specific formula based on pre-stored calibration information.

In some examples of the disclosure, Hall effect sensors can be utilized instead of a magnetometer. Multiple Hall effect sensors (e.g., three Hall effect sensors) can be affixed to the inner band and used to determine an absolute rotational position of rotating outer band 706 when the outer band is magnetized to form a single dipole. In some instances, Hall effect sensors can be advantageously utilized on the inner band to detect outer band rotations when space issues prevent a magnetometer from being located inside the jewel.

Although the magnetometer can be used to determine the rotational position of the rotating outer band, in some situations it can be difficult for a user to actually rotate the band, or determine that rotation of the band is actually occurring, particularly when visual confirmation of rotation is inconvenient or impossible.

Figure 9A:
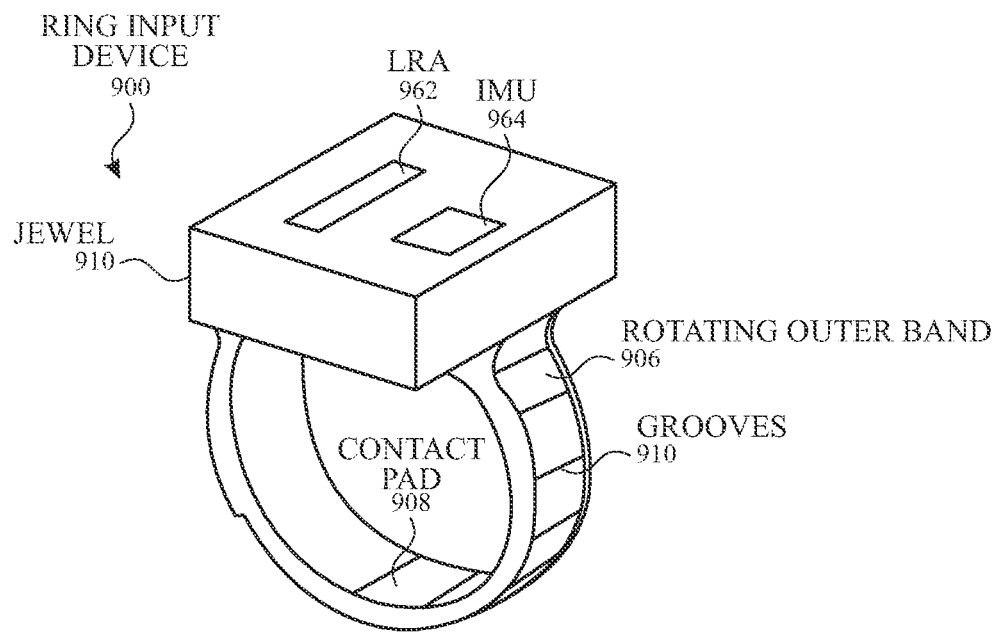
FIG. 9A is a symbolic perspective view of a ring input device including a rotating outer band with physical indicators such as grooves according to examples of the disclosure.

FIG. 9A is a symbolic perspective view of ring input device 900 including rotating outer band 906 with physical indicators such as grooves 960 according to examples of the disclosure. In the example of FIG. 9A, rotating outer band 906 can include grooves 960 to enable a user to feel the band and determine whether the band is actually rotating, or whether the band is stationary or nearly stationary and the user's finger is merely sliding over the band. Although grooves 960 are illustrated in FIG. 9A, in other examples physical indicators such as raised ridges, cavities, bumps and the like can also be formed on rotating outer band 906 to provide the user with tactile feedback as an alternative to visual feedback. In some examples, grooves 960 or other indicators can be spaced at certain intervals to give the user a sense of the amount of rotation. For example, if grooves 960 are spaced at 30 degree intervals, a user that repetitively brushes outer band 906 with a finger to rotate the band may be able to feel the passage of multiple grooves, and can stop when the desired amount of rotation is achieved.

In some examples, ring input device 900 may include linear resonant actuator (LRA) 962 or other haptic feedback device. LRA 962 can include a mass that moves linearly to generate haptic feedback. In the example of FIG. 9A, LRA 962 is located in jewel 910, but in other examples it may be located elsewhere in ring input device 900. In some examples, as an alternative to grooves 960, LRA 962 can generate a vibration or other force when rotating outer band 906 has rotated a certain number of degrees, as determined using the previously described magnetometer. In other examples, LRA 962 (or other haptic feedback generator) can generate haptic feedback at specific times based on the amount of rotation, a computed angular velocity and/or acceleration of rotating outer band 906, and/or the UI being manipulated, in either a uniform or non-uniform manner. For example, if it is determined that a UI including a short (e.g., 10 item) list is being scrolled, haptic feedback can be uniformly generated as each item in the list is highlighted. On the other hand, if the list is long (e.g., 100 items), haptic feedback can be generated as every 10th item is highlighted. In some examples, if the detected angular velocity is low (e.g., less than 90 degrees of rotation per second), haptic feedback can be generated as each item in the list is highlighted. However, if the detected angular velocity is high (e.g., greater than 90 degrees of rotation per second), haptic feedback can be generated as every 10th item is highlighted, or every 10th of a second, for example. Haptic feedback can also be generated non-uniformly. For example, based on an initial angular acceleration and/or velocity determination of rotating outer band 906, "momentum" scrolling of a UI can be performed, wherein the UI can scroll through a list of items that sharply increases in velocity, reaches a steady state, then decays in velocity until it stops. Haptic feedback can be non-uniformly generated to track the movement of the UI by increasing in frequency, reaching a steady state, and then decreasing in frequency until it stops, regardless of whether motion of outer band 906 continues after the initial angular acceleration and/or velocity determination. However, if outer band 906 is held or otherwise dampened to slow or stop rotation of the band, the haptic feedback can non-uniformly decrease in frequency to follow the deceleration of the band.

In some examples, LRA 962 (or other haptic feedback generator) can generate different types of haptic feedback based on the amount of rotation, a computed angular velocity and/or acceleration of rotating outer band 906, and/or the UI being manipulated, in either a uniform or non-uniform manner. For example, if the detected angular velocity of rotating outer band 906 is low, haptic feedback can be generated to simulate the feeling of a band being rotated with higher friction, and a coarse texture. In another example, if the detected angular velocity of rotating outer band 906 is high, haptic feedback can be generated to simulate the feeling of a band being rotated with lower friction, and a smoother texture. In another example, different textures of haptic feedback can be generated when an inertial measurement unit (described below) in ring input device 900 is used to move a 3D object in a computer-generated environment.

In other examples, LRA 962 can be used in conjunction with grooves 960, such that a vibration is generated each time the rotation of outer band 906 causes a groove to pass a certain location, where it can be detected using an optical sensor or the like. LRA 962 can also be used to generate haptic feedback independent of any rotation of outer band 906. For example, LRA 962 can generate haptic feedback to provide an alert to a user based on movement detected by an inertial measurement unit (discussed below), sound inputs (e.g., audio commands), sensor inputs, and/or signals (e.g., notifications) received wirelessly at ring input device 900, even when outer ring 906 is stationary.

In addition to rotating outer band 906 to initiate or perform operations as described above, examples of the disclosure can also determine positional information such as the orientation and movement of ring input device 900 itself in free space. Determining the orientation and movement of ring input device 900 in free space can provide a number of advantages. For example, a wearer of ring input device 900 can move the ring around in free space to generate rotational or orientation signals, or perform gestures such as hand swipes or waving that can trigger the wireless transmission of commands to a companion device. In one particular example, the orientation and movement of ring input device 900 from one position to another can be used to move a cursor on a user interface or a 3D object being displayed. In some examples, the gestures can be recognized in ring input device 900, and in other examples, data can be wirelessly transmitted for gesture processing by another device. It should be understood that the preceding description of uses is non-limiting and merely illustrative, and that determining the orientation and movement of ring input device 900 is contemplated for other purposes as well.

An inertial measurement unit (IMU) 964 can be used to determine the orientation and movement of ring input device 900. In the example of FIG. 9A, IMU 964 is located in jewel 910, but in other examples it may be located elsewhere in ring input device 900. In some examples, IMU 964 can include one or more accelerometers to detect linear acceleration and gyroscopes to detect rotational rate. In some examples, IMU 964 can include an accelerometer and gyroscope for each of the principal axes: pitch, roll and yaw. In some examples, IMU 964 can transmit positional information to a processor within jewel 910 to enable the jewel to compute the orientation, position and movement of ring input device 900. In other examples, one or more of these computations can be performed within IMU 964.

Figure 9B:
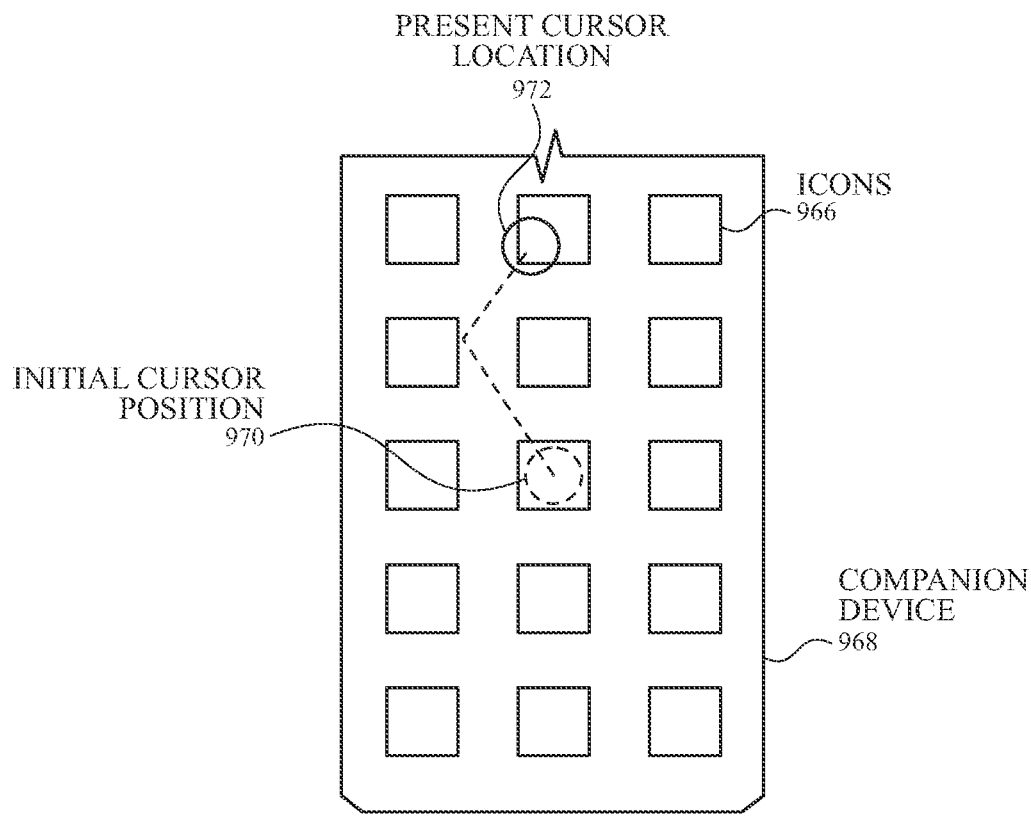
FIG. 9B is a symbolic view of a user interface with icons displayed on the touchscreen of a companion device according to examples of the disclosure.

FIG. 9B is a symbolic view of a user interface with icons 966 displayed on the touchscreen of companion device 968 according to examples of the disclosure. In the example of FIG. 9B, a touch input (explained hereinbelow) on rotating outer band 906 of a ring input device can be detected, and a signal can be wirelessly transmitted to companion device 968 to display a user interface and a cursor at initial position 970 (e.g., in the center of the user interface), or to display the cursor if the user interface was already being displayed. Thereafter, movement of ring input device 900 can be detected, and the cursor can move on the user interface in accordance with the detected movements of the ring. In the example of FIG. 9B, the cursor has moved to present location 972. In some examples, a press input (explained hereinbelow) can select the icon appearing under the cursor. In other examples, LRA 962 can generate haptic feedback as the cursor moves over an icon, providing additional advantageous feedback to the user. It should be understand that the example of FIG. 9B is only one example of how IMU 964 can be utilized along with movements of ring input device 900 to initiate and/or perform operations on a companion device.

When IMU 964 in ring input device 900 is used to control an object such as a 3D object being displayed, in some examples the virtual object can be rotated along all three axes (X, Y and Z). However, in other examples, one or two of the axes can be locked to limit the rotation of the object. For example, the Y axis can be locked such that movement of ring input device 900 can only cause rotations of the object about the X and/or Z axis. In some examples, moving a cursor over an axis, followed by a press input on outer band 906, can cause that axis to be locked. Locking an axis can eliminate unintended motion and enable more precise movements to be detected by ring input device 900.

In addition to detecting the position of ring input device 900 or detecting the rotational position of outer ring 906 with or without modulated resistance a described above, detecting presses on rotating outer band 906 can provide additional advantages. For example, after outer band 906 is rotated to a desired position, one or more detected presses on the band can initiate further action, such as selection of an item. Even in the absence of rotation, a press on rotating outer band 906 can initiate operations, such as triggering a left mouse click input (single click) or a right mouse click input (double click), moving in discrete steps through a list, moving through a document using page view, jumping to different items or icons, incrementing or decrementing a parameter, or terminating an operation. A press and hold input, or a press and rotate input, can also be detected to perform or initiate other operations. It should be understood that the preceding description of uses is non-limiting and merely illustrative, and that detecting presses on rotating outer band 906 is contemplated for other purposes as well.

Figure 10A:
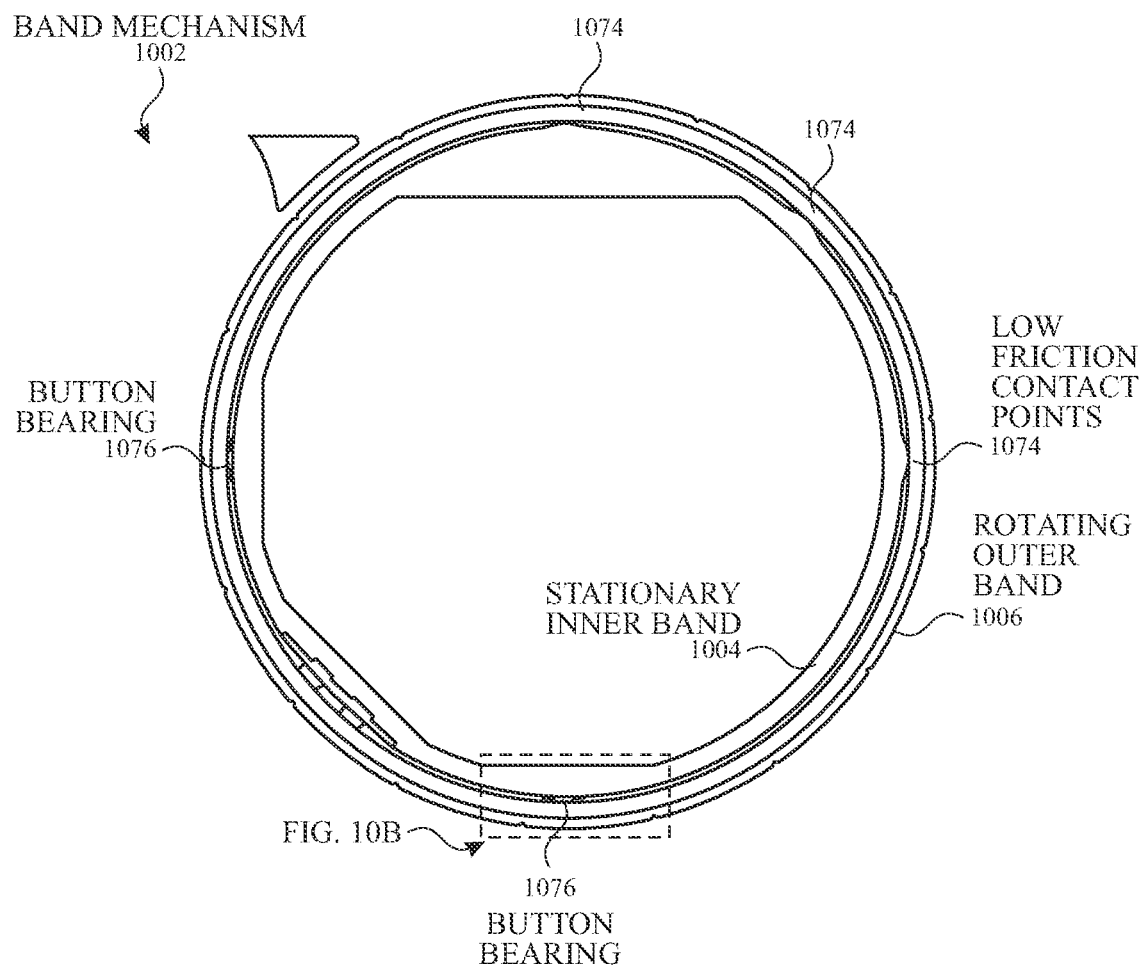
FIG. 10A is a side view of a band mechanism of a ring input device including low friction contact points and button bearings according to examples of the disclosure.

FIG. 10A is a side view of band mechanism 1002 of a ring input device including low friction contact points 1074 and button bearings 1076 according to examples of the disclosure. As defined herein, a button bearing is a mechanism that acts both as a button and also as a low-friction bearing. Low friction contact points 1074 and button bearings 1076 can allow outer band 1006 to rotate about stationary inner band 1004 with reduced friction. In some examples, both low friction contact points 1074 and button bearings 1076 can be ball bearings. In other examples, low friction contact points 1074 can be fixed contact points that extend along most or all of the width of stationary inner band 1004, while button bearings 1076 can be ball bearings. In still other examples, low friction contact points 1074 can be fixed contact points, while button bearings 1076 can be pressure-sensitive input mechanisms such as dome switches or other types of switches or mechanisms capable of generating "open" and "closed" states. These pressure-sensitive input mechanisms can include resistive strain gauge sensors whose resistance changes with pressure, optical strain gauge sensors whose reflected light properties change with pressure, and more generally analog force sensors capable of generating analog output values in response to different levels of pressure. Other examples of pressure-sensitive input mechanisms can include capacitive force sensors, whose capacitance across two plates changes as pressure causes a deformable material between the two plates to compress and change the distance between the plates. Using pressure-sensitive input mechanisms for button bearings 1076 creates a multi-functional element, where the pressure-sensitive input mechanisms serves as both a bearing for rotating outer band 1006 and also a mechanism for generating a press input.

Figure 10B:
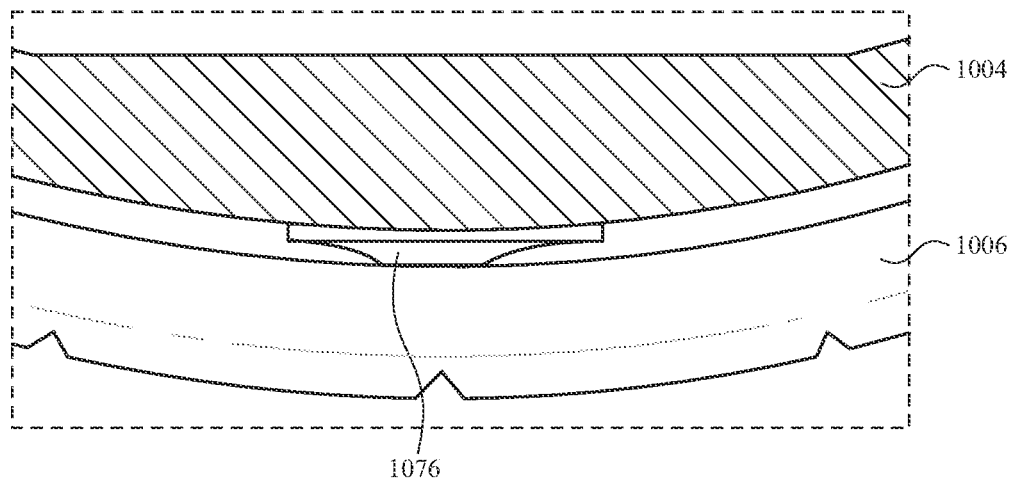
FIG. 10B is an enlarged side view of a pressure-sensitive input mechanism in the form of a dome switch button bearing as indicated by the dashed lines in FIG. 10A according to examples of the disclosure.

FIG. 10B is an enlarged side view of a pressure-sensitive input mechanism in the form of dome switch button bearing 1076 as indicated by the dashed lines in FIG. 10A according to examples of the disclosure. In some examples, dome switch button bearing 1076 can include a compressible dome (pointing downwards in the example of FIG. 10B) made of a nonconductive material such as rubber or polyurethane that can compress under pressure but return to its original shape in the absence of pressure. Within compressible dome are one or more pairs of contacts that make electrical contact (e.g., short-circuit) when the dome is sufficiently compressed, but remain open in the absence of sufficient compression. Although two-stage dome switches (open or closed) are primarily disclosed herein, it should be understood that dome switches according to examples of the disclosure can include multiple-stage dome switches.

Referring again to FIG. 10A, pressure applied to rotating outer band 1006 at or near the locations of low friction contact points 1074 should result in little or no compression or movement when the contact points are formed as fixed contact points. Thus, fixed contact points can be used in locations where a press input is not expected, such as under the jewel. However, pressure applied to rotating outer band 1006 at or near the locations of dome switch button bearings 1076 can result in compression or movement of the dome switches, and possibly activation of the switches. The activation area of the dome switches can depend on the configuration of the dome switches (for example, the height of the dome, and/or the size and shape of the base upon which the dome sits), the gap between stationary inner band 1004 and rotating outer band 1006, and the material of the inner band. In some examples, pressure applied within about 45 degrees on either side of the dome switches can still activate (i.e., close) the switches. Although two dome switch button bearings 1076 are shown in FIG. 10A, in other examples only a single dome switch can be employed, or three or more dome switches can also be utilized. With two or more dome switches, different functions can be initiated depending on which dome switch is pressed, or the same function can be initiated regardless of which dome switch is pressed. In some examples, pressure applied between two adjacent dome switches can activate both switches, which can initiate other functions.

As mentioned above, the activation area of the dome switches can vary. Variations in the activation area of a dome switch (and therefore the activation area of a button within the band mechanism of a ring input device) can provide a number of advantages. For example, a wide activation area can allow a user to activate a button without having to precisely know the location of that button within the rotating outer band. This can be especially useful when the user wants to press a button but is not looking at the ring. On the other hand, a narrow activation area can enable multiple buttons to be placed within the band mechanism, with each button capable of being activated independently. Narrow activation areas can also reduce inadvertent button presses.

Figure 11A:
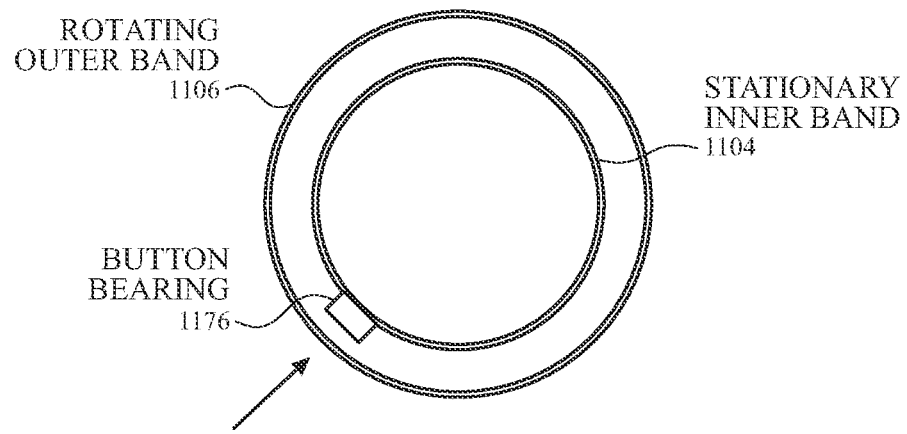
FIGS. 11A-11B are simplified symbolic side views (not to scale) of a rotating outer band and a stationary inner band, with the inner bands having different levels of rigidity according to examples of the disclosure.
Figure 11B:
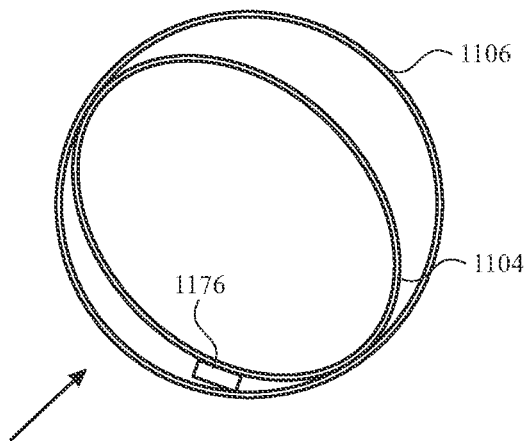

FIGS. 11A-11B are simplified symbolic side views (not to scale) of rotating outer band 1106 and stationary inner band 1104, with the inner bands having different levels of rigidity according to examples of the disclosure. FIG. 11A is an example of a dome switch with a wide activation area, where stationary inner band 1104 can be formed from a material having high rigidity. When pressure is applied on rotating outer band 1106 at a location offset from dome switch button bearing 1176, because neither the outer band nor stationary inner band 1104 experiences significant deformation, sufficient pressure can be applied against the dome switch to activate it. In some examples, pressure can be applied as much as 60 degrees or more on either side of dome switch button bearing 1176 to activate the switch.

In contrast, FIG. 11B is an example of a dome switch with a narrower activation area, where stationary inner band 1104 can be formed from a softer, more flexible material. When pressure is applied on rotating outer band 1106 at a location offset from dome switch button bearing 1176, the outer band can contact the dome switch without activating it. As pressure on the dome switch continues (without sufficient pressure to activate the switch), stationary inner band 1104 can begin to deform, and may continue to deform until it contacts rotating outer band 1106 at locations 1178. At this point, further deformation of stationary inner band 1104 may cease, leaving dome switch button bearing 1176 without sufficient pressure to activate it. In the example of FIG. 11B, activation may occur only when the pressure is applied close enough to dome switch button bearing 1176 such that the switch is activated before deformed stationary inner band 1104 makes contact with rotating outer band 1106. In some examples, pressure can be applied no further than about 5 degrees on either side of dome switch button bearing 1176 before inner band 1104 contacts outer band 1106 and prevents activation of the switch.

Figure 11C:
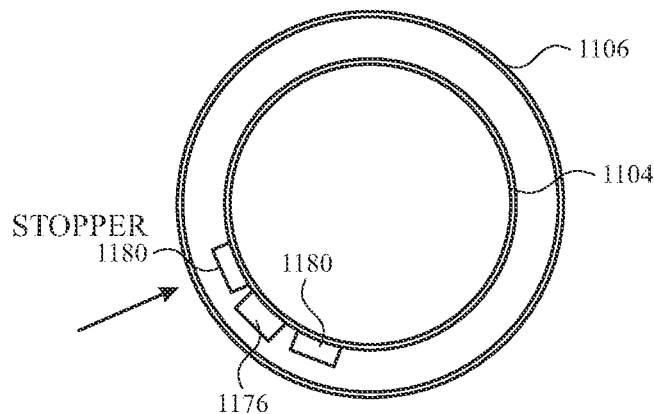
FIG. 11C is a simplified symbolic side view (not to scale) of a rotating outer band and a stationary inner band, with the inner bands having stoppers on either side of a dome switch button bearing according to examples of the disclosure.

FIG. 11C is a simplified symbolic side view (not to scale) of rotating outer band 1106 and stationary inner band 1104, with the inner bands having stoppers 1180 on either side of dome switch button bearing 1176 according to examples of the disclosure. In the example of FIG. 11C, stoppers 1180 are utilized to narrow the activation area of dome switch button bearing 1176. Stoppers 1180 can be button bearings or fixed contact points that allow for direct pressure on dome switch button bearing 1176 to activate the switch, but also limit the radial travel of rotating outer band 1106 to prevent it from activating the switch when pressure is applied at a location offset from that of the switch. When pressure is initially applied on rotating outer band 1106 at a location offset from dome switch button bearing 1176, the outer band may contact the dome switch without activating it. As pressure on the dome switch continues (without sufficient pressure to activate the switch), rotating outer band 1106 can come into contact with stopper 1180. At this point, further pressure on dome switch button bearing 1176 may cease, leaving the switch without sufficient pressure to activate it. In the example of FIG. 11C, activation may occur only when the pressure is applied close enough to dome switch button bearing 1176 such that the switch is activated before stopper 1180 makes contact with rotating outer band 1106.

In addition to detecting presses on outer band 1106 as described above, detecting touches on the outer band can provide additional advantages. For example, touch sensing can help distinguish a valid press input (e.g., caused by a user's finger) from an inadvertent press input (e.g., accidentally pressing outer band 1106 against a desk or other ungrounded object). In another example, after outer band 1106 is rotated to a desired position, one or more detected touches or taps on the band (without detected presses) can initiate further actions. Even in the absence of rotation, one or more detected touches or taps on outer band 1106 can initiate operations, such as bringing up a user interface, or "peeking" to temporarily view content. A touch-and-hold input, or a touch-and-rotate input (as opposed to a swipe-to-rotate input), can also be detected to perform or initiate other operations. It should be understood that the preceding description of uses is non-limiting and merely illustrative, and that detecting touches on rotating outer band 1106 is contemplated for other purposes as well.

Figure 12A:
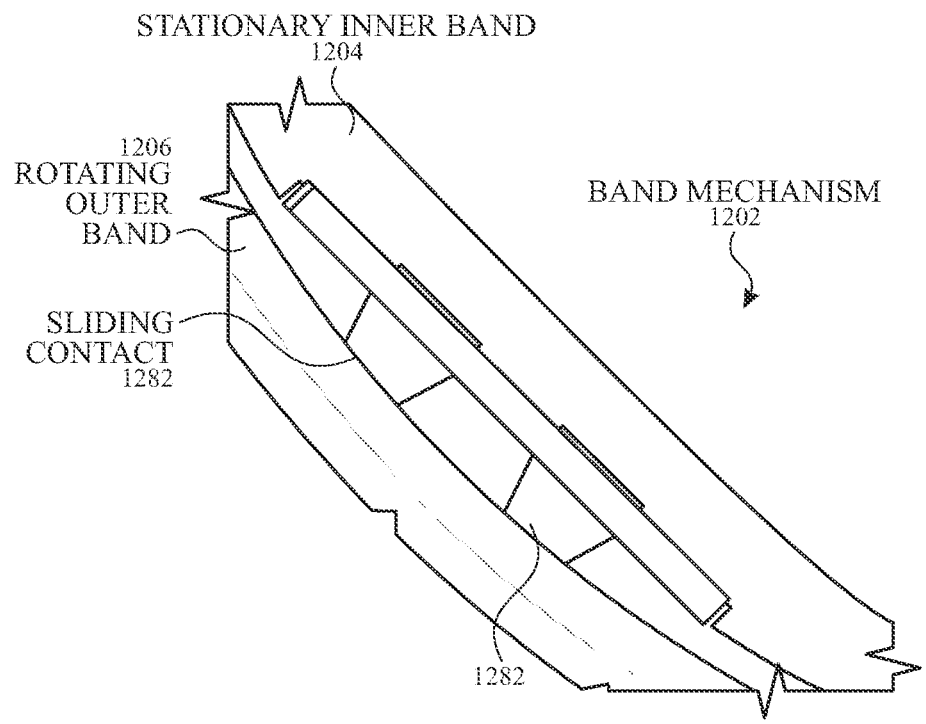
FIG. 12A is a symbolic side view of a portion of a band mechanism including a stationary inner band and a rotating outer band with sliding contacts to provide touch sensing according to examples of the disclosure.

FIG. 12A is a symbolic side view of a portion of band mechanism 1202 including stationary inner band 1204 and rotating outer band 1206 with sliding contacts 1282 to provide touch sensing according to examples of the disclosure. In some examples, touch sensing can be accomplished by utilizing the entire conductive outer band 1206 as a self-capacitance touch electrode, where the electrode's self-capacitance to ground can be measured, and changes to this self-capacitance can be detected and recognized as being the result of a touch. In the example of FIG. 12A, sliding contacts 1282 can be affixed to stationary inner band 1204 and can make electrical contact with outer band 1206 (acting as a self-capacitance electrode) when the outer band is stationary, and can continue to maintain sliding contact with the outer band when it rotates, providing an electrical connection from outer band 1206 to inner band 1204. Although FIG. 12A shows two sliding contacts 1282, in other examples only one sliding contact can be used, or more than two sliding contacts can be used. In addition, one or more ground contacts (not shown) on the interior of inner band 1204 can provide a reference ground for the ring input device, which can be coupled to earth ground when a user is wearing the ring and making contact with the ground contacts. With the electrical connections to the self-capacitance electrode and reference ground available at inner band 1204, the self-capacitance of outer band 1206 can be measured and touches can be detected.

Figure 12B:
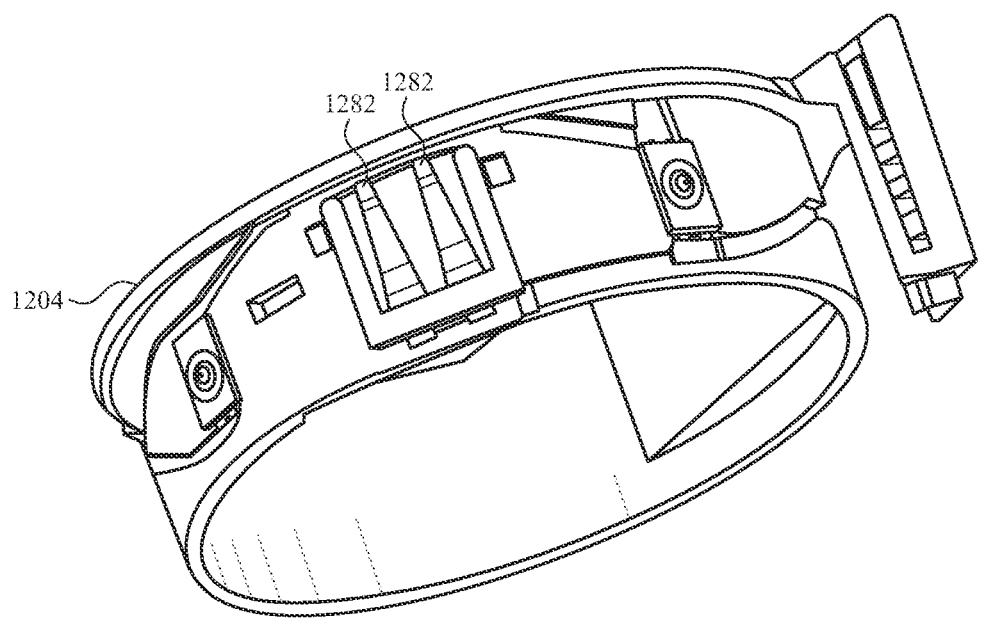
FIG. 12B is a perspective view of a portion of a band mechanism showing a leaf spring sliding contact on a stationary inner band according to examples of the disclosure.

FIG. 12B is a perspective view of stationary inner band 1204 showing leaf spring sliding contact 1282 on stationary inner band 1204 according to examples of the disclosure. In the example of FIG. 12B, leaf spring sliding contact 1282 is oriented perpendicular to the direction of rotation of the outer band (not shown in FIG. 12B). Although FIG. 12 B illustrates sliding contact 1282 as a leaf spring, in other examples different types of sliding contacts can be utilized, including brushes, fixed or rotating conductive bearings, and the like. In addition, in other examples the orientation of the sliding contact can be parallel to the direction of rotation of the outer band. In further examples, outer band 1206 can be formed from two parallel conductive (but isolated) circumferential strips, sliding contact 1282 can be formed as two isolated contacts oriented in parallel to the direction of rotation of the outer band for separately contacting the circumferential strips, and mutual capacitance sensing can be performed between the two circumferential strips.

Figure 13A:
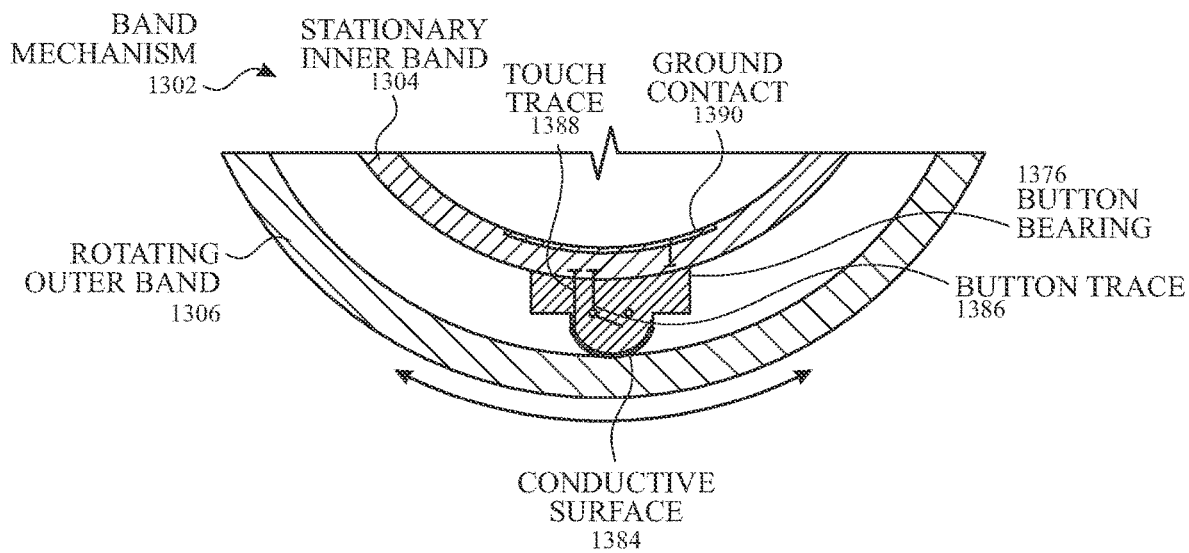
FIG. 13A is a symbolic side view of a section of a band mechanism showing a button bearing affixed to an inner band, where the button bearing can also serve as a sliding contact according to examples of the disclosure.

FIG. 13A is a symbolic side view of a section of band mechanism 1302 showing button bearing 1376 affixed to inner band 1304, where the button bearing can also serve as a sliding contact according to examples of the disclosure. In the example of FIG. 13A, instead of utilizing a separate sliding contact to provide electrical contact with outer band 1306, conductive surface 1384 can be added to the previously described dome switch button bearing 1376 to provide the sliding contact.

Dome switch button bearing 1376 can include a nonconductive (e.g., rubber) dome, and button trace 1386 can be connected to a switch or bipolar mechanism in the dome switch (represented symbolically as a single pole, single throw switch in FIG. 13A). However, in the example of FIG. 13A, conductive surface 1384 can be added to the nonconductive dome, and touch trace 1388 can be connected to the conductive surface. In addition, ground contact 1390 on the interior of inner band 1304 can provide a reference ground for the ring input device, which can be coupled to earth ground when a user is wearing the ring and making contact with the ground contacts. In some examples, the "throw" contact of the switch mechanism can also be connected to ground contact 1390. With button trace 1386, touch trace 1388 and ground contact 1390 available at inner band 1304, both a press of dome switch button bearing 1376 and a touch anywhere along outer band 1306 can be detected. Thus, dome switch button bearing 1376 can serve three functions: it can act as a bearing between inner band 1304 and outer band 1306, it can provide touch trace 1388 for touch sensing, and it can provide button trace 1386 for press input sensing.

Figure 13B:
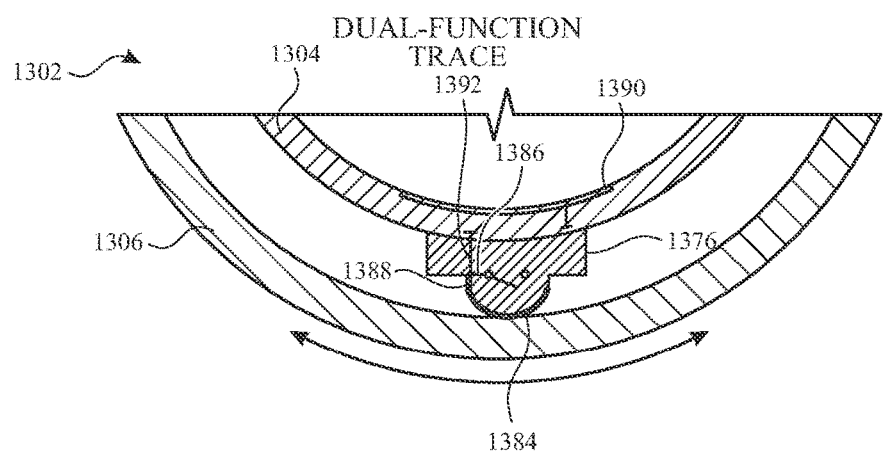
FIG. 13B is a symbolic side view of a section of a band mechanism showing a dome switch button bearing affixed to an inner band, where the button bearing can also serve as a sliding contact with a reduced number of traces according to examples of the disclosure.

FIG. 13B is a symbolic side view of a section of band mechanism 1302 showing dome switch button bearing 1376 affixed to inner band 1304, where the button bearing can also serve as a sliding contact with a reduced number of traces according to examples of the disclosure. The example of FIG. 13B is similar to FIG. 13A, except that button trace 1386 and touch trace 1388 can be electrically coupled together and brought out of button bearing 1376 as a single dual-function trace 1392. This reduction of a trace can advantageously reduce the number of conductive lines, contacts, pads and pins needed to route the trace to the jewel of the ring input device, reduce cost, save space, and increase reliability. This reduction of a trace is possible because dual-function trace 1392 (which connects together button trace 1386 and touch trace 1388) can be utilized for different purposes at different times. As shown in FIG. 13B, when dome switch button bearing 1376 is not activated (i.e., the switch is open), dual-function trace 1392 is connected only to outer band 1306 via conductive surface 1384, and the trace can be used to read the self-capacitance on the conductive surface (i.e., detect a touch) in the usual manner. When sufficient pressure has been applied to activate dome switch button bearing 1376 (i.e., the switch is closed), the closed switch can force trace 1392 to a fixed potential (e.g., ground 1390), which can indicate that a valid press input has been received. At this point, because trace 1392 is held at a fixed potential, it can no longer be used to detect a touch. However, because a valid press input implies a touch, touch detection is no longer needed, and the fixed potential on trace 1392 can be interpreted as a valid touch.

Figure 13C:
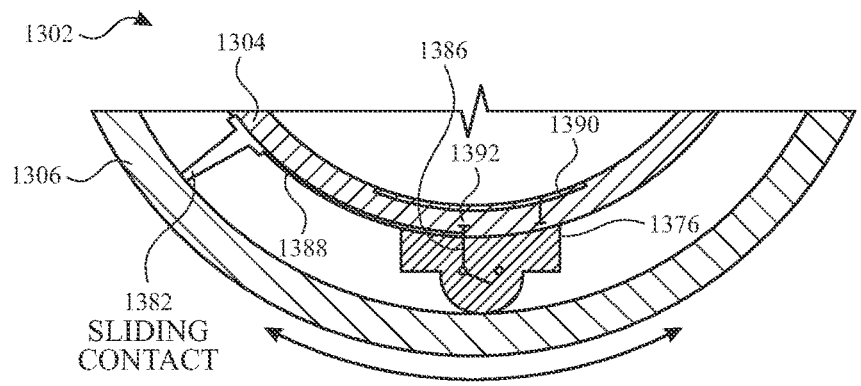
FIG. 13C is a symbolic side view of a section of a band mechanism showing a sliding contact and a button bearing affixed to an inner band with a reduced number of traces according to examples of the disclosure.

FIG. 13C is a symbolic side view of a section of band mechanism 1302 showing sliding contact 1382 and button bearing 1376 affixed to inner band 1304 with a reduced number of traces according to examples of the disclosure. The example of FIG. 13C is similar to FIG. 13B, except that instead of a conductive surface of dome switch button bearing 1376 providing electrical contact with conductive outer band 1306, a single sliding contact 1382 (discussed above) is used for that purpose. Nevertheless, button trace 1386 and touch trace 1388 can be electrically coupled together and brought out of button bearing 1376 as a single dual-function trace 1392. As with the examples of FIG. 13B, this reduction of a trace provides advantages and is possible because dual-function trace 1392 (which connects together button trace 186 and touch trace 1388) can be utilized for different purposes at different times. As shown in FIG. 13B, when dome switch button bearing 1376 is not activated (i.e., the switch is open), dual-function trace 1392 is connected only to outer band 1306 via sliding contact 1382, and the trace can be used to read the self-capacitance on the conductive surface (i.e., detect a touch) in the usual manner. When sufficient pressure has been applied to activate dome switch button bearing 1376 (i.e., the switch is closed), the closed switch can force dual-function trace 1392 to a fixed potential (e.g., ground 1390), which can indicate that a valid press input has been received. At this point, because dual-function trace 1392 is held at a fixed potential it can no longer be used to detect a touch. However, because a valid press input implies a touch, touch detection is no longer needed, and the fixed potential on dual-function trace 1392 can be interpreted as a valid touch.

Figure 13D:
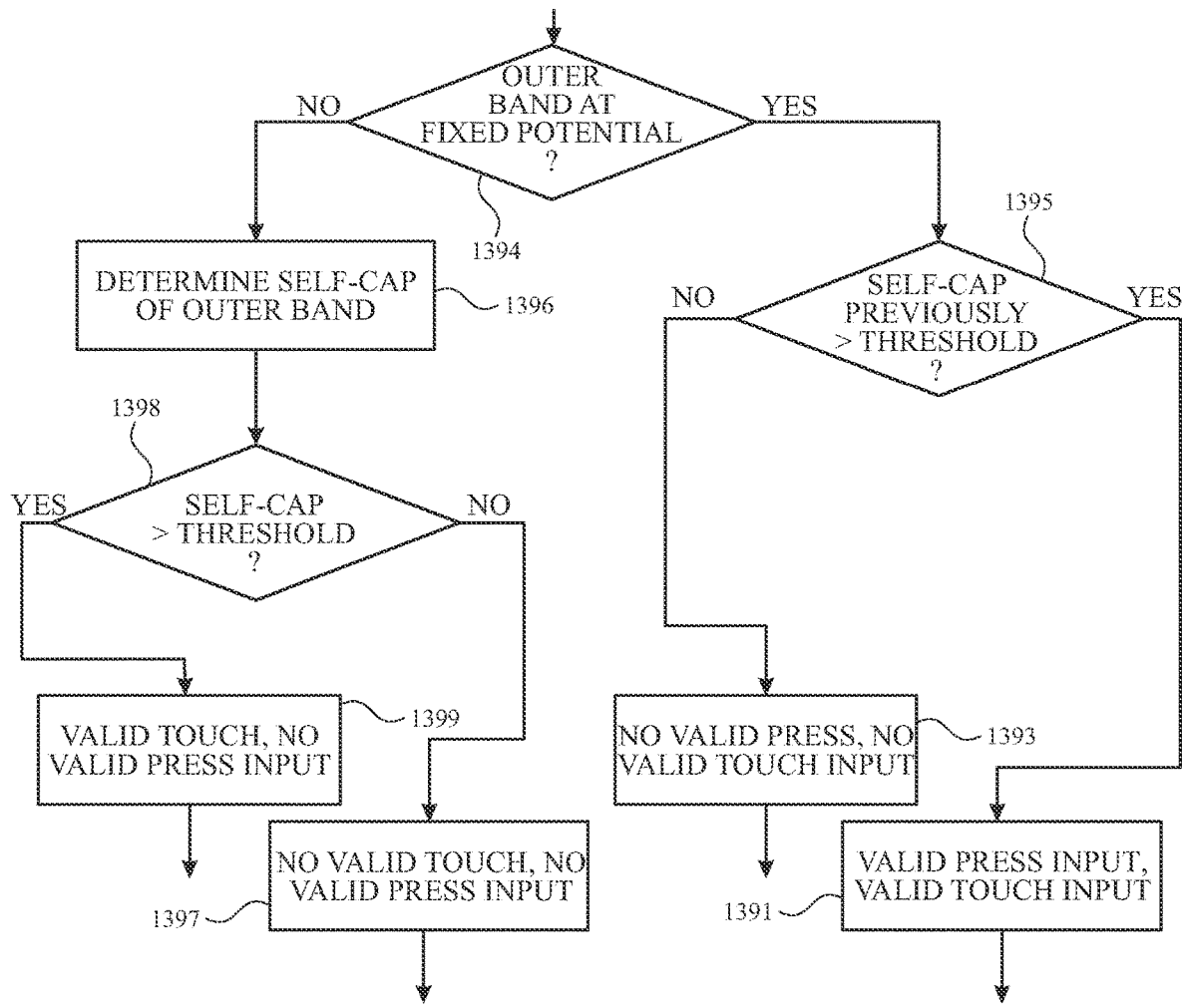
FIG. 13D is flowchart of a method for detecting a valid touch or press input on a ring input device according to examples of the disclosure.

FIG. 13D is flowchart of a method for detecting a valid touch or press input on a ring input device according to examples of the disclosure. In the example of FIG. 13D, at 1394 it can be determined whether outer band 1306 is being held at a fixed potential (e.g., ground), indicating that the dome switch has been activated (i.e., the dome switch is closed). When it is determined that outer band 1306 is not being held at a fixed potential (i.e., the dome switch is open), then at 1396 the self-capacitance of outer band 1306 can be determined. At 1398 it can be determined whether the self-capacitance is greater than a predetermined threshold (indicative of valid a touch from a grounded object such as a finger). When the self-capacitance is greater than the predetermined threshold, then at 1399 it can be determined that a valid touch input without a valid press input has been received, and thereafter the method can be re-initiated at 1394. When the self-capacitance is not greater than the predetermined threshold, then at 1397 it can be determined that no valid touch input and no valid press input has been received, and the method can thereafter be re-initiated at 1394. The predetermined threshold can be selected such that unintended touches of ungrounded or poorly grounded objects against outer band 1306 (e.g., hitting outer band 1306 against a table) should not increase the self-capacitance of outer band 1306 above the predetermined threshold and cause a valid touch input to be recognized.

At 1394, a determination that outer band 1306 is being held at a fixed potential does not necessarily mean that a valid press input has been received, because an accidental press input can also activate (close) dome switch button bearing 1376 and force outer band 1306 to the fixed reference potential (e.g., ground). However, as mentioned above, touch sensing can help distinguish a valid press input (e.g., caused by a user's finger) from an inadvertent press input (e.g., caused by accidentally pressing outer band 1306 against an ungrounded object such as a desk). Because a valid touch input should always precede a valid press input, to disambiguate a valid press input from an inadvertent press input, when outer band 1306 is determined to be held at a fixed potential at 1394, then at 1395 a further determination can be made as to whether the self-capacitance of outer band 1306 was greater than the predetermined threshold (indicative of a valid touch input) just prior to the determination that the outer band was driven to a fixed potential. In some examples, this can be accomplished by saving the determined state of outer band at periodic intervals (e.g., 100 millisecond intervals). A valid press input (e.g., caused by a user's finger) will produce a sequence of valid touch input readings (i.e., self-capacitance levels above the predetermined threshold) prior to a fixed potential reading. An invalid press input (e.g., caused by an ungrounded or poorly grounded object) will produce a sequence of invalid touch input readings (i.e., self-capacitance levels below the predetermined threshold) prior to a fixed potential reading. When the valid press input sequence is captured, then at 1391 it can be concluded that a valid press input has been received, and the method can thereafter be re-initiated at 1394. On the other hand, when the invalid press input sequence is captured, then at 1393 it can be concluded that a valid press input has not been received (e.g., only a press input from a nonconductive object was received), and the method can thereafter be re-initiated at 1394.

Figure 13E:
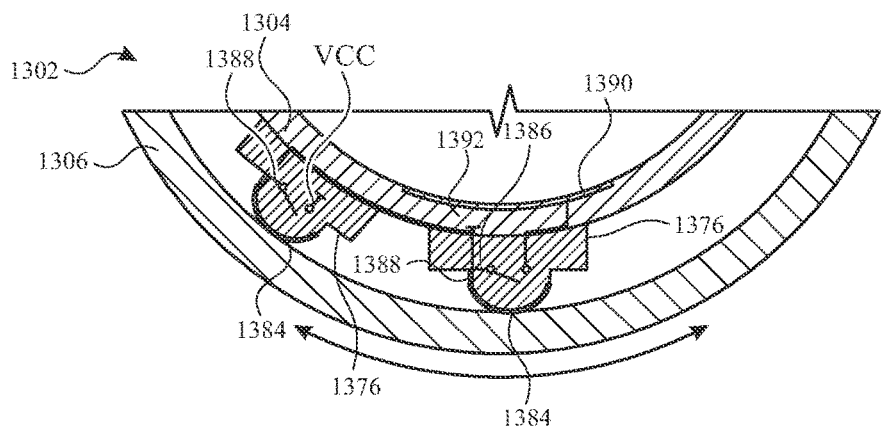
FIG. 13E is a symbolic side view of a section of a band mechanism showing two dome switch button bearings affixed to an inner band, where the button bearings can serve as sliding contacts with a reduced number of traces according to examples of the disclosure.

FIG. 13E is a symbolic side view of a section of band mechanism 1302 showing two dome switch button bearings 1376 affixed to inner band 1304, where the button bearings can serve as sliding contacts with a reduced number of traces according to examples of the disclosure. In the example of FIG. 13E, the button traces 1386 and touch traces 1388 of both dome switch button bearings 1376 are all electrically connected together and brought out as a single trace 1392. This reduction of three traces can advantageously reduce the number of conductive lines, contacts, pads and pins needed to route the trace to the jewel of the ring input device, reduce cost, save space, and increase reliability. This reduction of traces is possible because trace 1392 can be utilized for different purposes at different times. As shown in FIG. 13E, when both dome switch button bearings 1376 are not activated (i.e., the switches are open), trace 1392 is connected only to outer band 1306 via the touch traces 1388 and conductive surfaces 1384 of both dome switches, and trace 1392 can be used to read the self-capacitance on outer band 1306 (i.e., detect a touch) in the usual manner. When sufficient pressure has been applied to activate the center dome switch button bearing 1376 in FIG. 13E (i.e., the switch is closed), the closed switch can force trace 1392 to a first fixed potential (e.g., ground 1390), which can indicate that a valid press input has been received at the center dome switch. On the other hand, when sufficient pressure has been applied to activate the left dome switch button bearing 1376 in FIG. 13E (i.e., the switch is closed), the closed switch can force trace 1392 to a second fixed potential (e.g., Vcc 1389), which can indicate that a valid press input has been received at the left dome switch. Thus, the voltage level of the fixed potential at trace 1392 can determine which dome switch button bearing 1376 is being pressed. In either situation, because trace 1392 is held at a fixed potential when either of the two dome switch button bearings 1376 is pressed, it can no longer be used to detect a touch. However, because a valid press input implies a touch, touch detection is no longer needed, and the fixed potential on trace 1392 can be assumed to be a valid touch. It should be understood that in the example of FIG. 13E, the two dome switch button bearings 1376 should not be activated at the same time, otherwise a short circuit between Vcc and ground, for example, could occur.

Figure 14A:
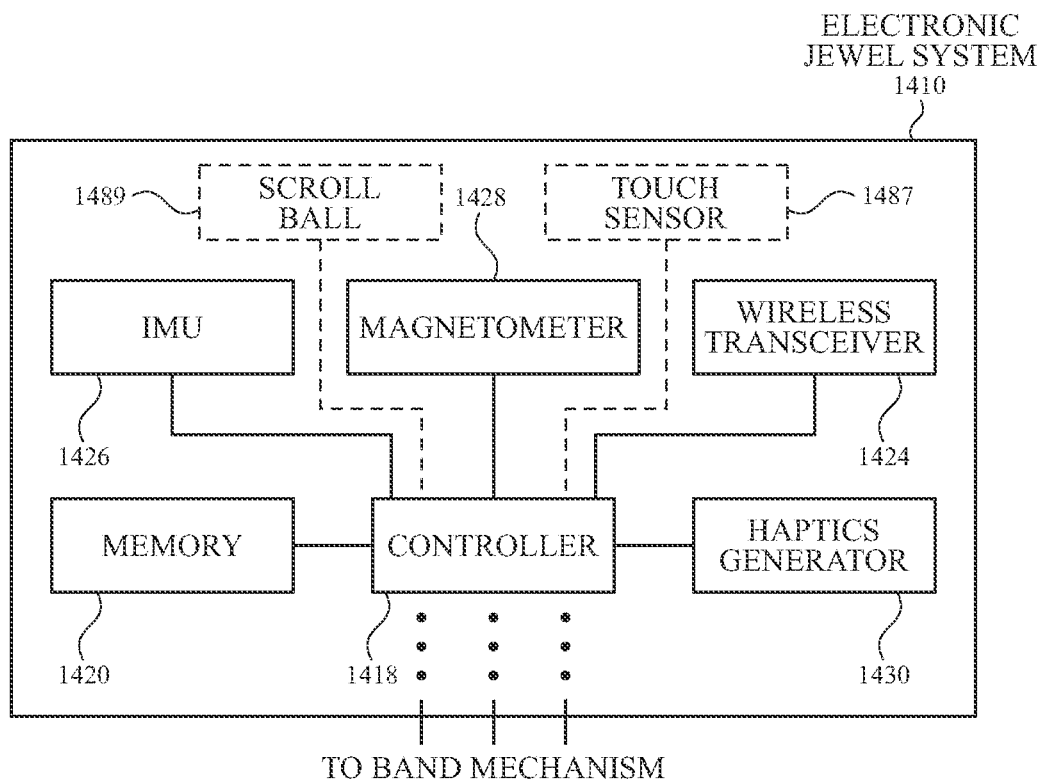
FIG. 14A is a system block diagram of an electronic jewel system of a ring input device including a scroll ball and a touch sensor according to examples of the disclosure.

FIG. 14A is a system block diagram of electronic jewel system 1410 of a ring input device including scroll ball 1489 and touch sensor 1487 according to examples of the disclosure. The example of FIG. 14A is similar to the system of FIG. 2, except that it includes scroll ball 1489 and touch sensor 1487. In some examples, touch sensor 1487 can be an optical sensor, but other examples it can be a capacitive touch sensor, a resistive touch sensor, an ultrasonic touch sensor, and the like. In some examples, either scroll ball 1489 or touch sensor 1487 can be included in electronic jewel system 1410, but not both. In other examples, both scroll ball 1489 and touch sensor 1487 can be employed. Although the dashed lines of scroll ball 1489 and touch sensor 1487 indicate their optional nature, it should be understood that dashed and solid lines throughout the drawings are not intended to conclusively convey optional or required features. For example, IMU 1426, magnetometer 1428, haptics generator 1430, scroll ball 1489 and touch sensor 1487 in FIG. 14A can all be utilized or omitted in any number of combinations and permutations, as evidenced by the use of the word "example" or "examples" throughout the disclosure to ensure that no figure or description is interpreted as a requirement.

Figure 14B:
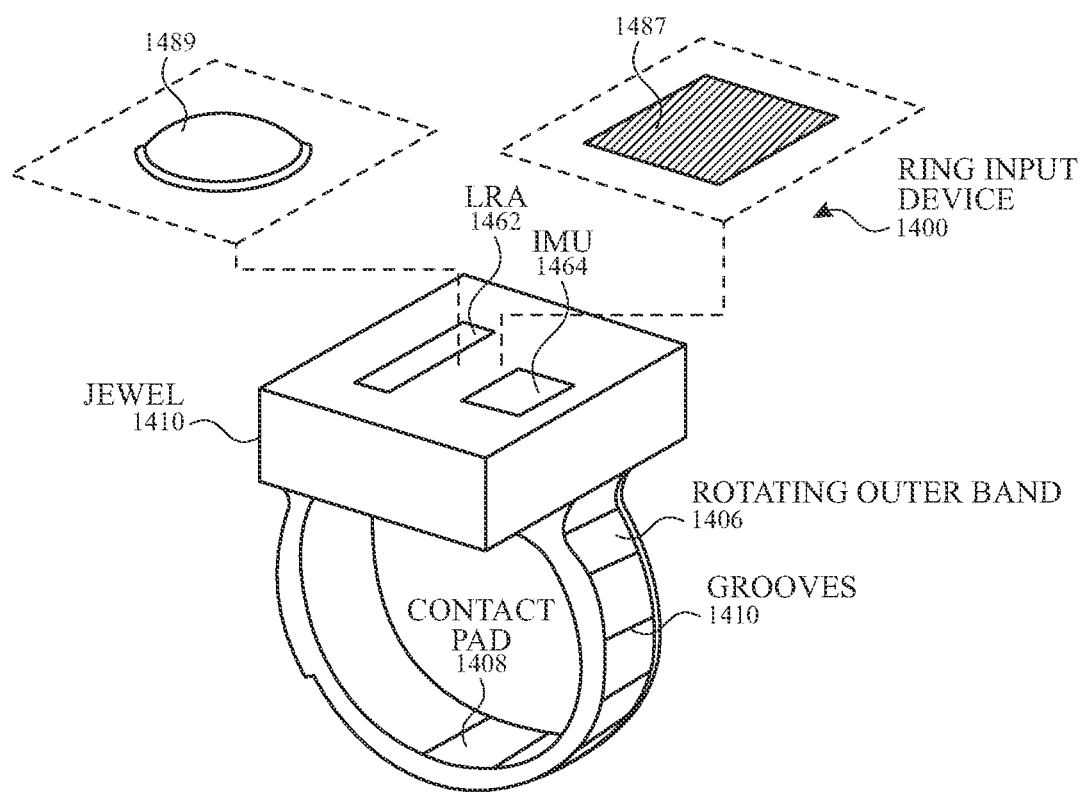
FIG. 14B is a symbolic perspective view of a ring input device including an electronic jewel system with a scroll ball and a touch sensor according to examples of the disclosure.

FIG. 14B is a symbolic perspective view of ring input device 1400 including electronic jewel system 1410 with scroll ball 1489 and touch sensor 1487 according to examples of the disclosure. As discussed above, in some examples electronic jewel system 1410 can include scroll ball 1489. Scroll ball 1489 can be used as an alternative to rotating outer band 1406 or in addition to the rotating outer band to provide directional input in two dimensions. Although not shown in FIG. 14B, in some examples scroll ball 1489 can also include a tactile switch to detect a press input on the scroll ball. The tactile switch can be used as an alternative to, or in addition to a press input on rotating outer band. Scroll ball 1489 can enable a user to provide directional input in two dimensions to perform operations such as moving a cursor, scrolling through a list, panning an image, and the like. The tactile switch can be used for selecting an item, performing a mouse click, moving or taking discrete steps or increments, and the like. Similar operations can be performed by touch sensor 1487, which in some examples can also include a tactile switch (not shown).

In some examples, inputs from scroll ball 1489 and/or touch sensor 1487 can be utilized in combination with inputs from one or more other devices such as rotating outer band 1406 (and press inputs detectable thereon), IMU 1464 and/or magnetometer 1428 to generate different types of gesture inputs to perform or initiate different operations. To provide just one example (of many possible examples) for purposes of illustration only, two-dimensional movement on scroll ball 1489 can be detected along with up-and-down movement of ring input device 1400 (from IMU 1426) to move an object in three dimensions in a computer-generated environment.

As described above, the ring input device according to the examples of the disclosure can include a band mechanism having a stationary inner band and a rotating outer band. In some examples of the disclosure, the rotating outer band can be made out of a conductive material such as steel. The other parts of the band mechanism can be made of metal, ceramic, leather, fabric and the like to provide fashion choices. The band mechanism can be wide or narrow.

As described above, the rotating outer band can produce variable rotational resistance, sense the rotational position of the outer band, detect the orientation and movement of the ring itself, provide haptic feedback whether the outer band is rotating or stationary, and can provide press and touch input sensing. The ring input device can be used to provide inputs to companion wearable devices such as smart watches, health monitoring devices, headphones and ear buds, provide inputs to handheld devices such as smartphones, tablet and laptop computing devices, media players, styluses, wands or gloves for computer-generated environments, and provide inputs to stationary devices such as desktop computers, smart home control and entertainment devices. In some examples, the ring input device can receive input from a companion device and provide information to the wearer of the ring (e.g., alerts).

Because of its touch and press input capabilities, the outer band can be susceptible to inadvertent touch or press inputs from a wearer's other fingers. For example, if the ring input device is worn on the ring or middle finger, fingers on either side of the ring can accidentally generate touch or press inputs on either side of the ring, whereas if the ring is worn on the index finger, only the middle finger can accidentally generate touch or press inputs on one side of the ring. Accordingly, in some examples the ring portion can be protected by one or more guards to prevent adjacent fingers or other objects from generating accidental touches. In some examples, the ring input device can have a permanent guard and also locations for attachable (e.g., snap-fit) guards. These guards can be configurable to protect different areas of the outer band, depending on which finger the ring is being worn on.

As described above, the ring input device according to examples of the disclosure can include a jewel that can contain most of the electronics of the ring. In some examples, the jewel can be removably connectable to the band mechanism using pogo pins or other electrical or magnetic connections. The jewel can be made or configured with different shapes, styles and/or colors to provide a fashion choice. The ability to attach different jewels to different band mechanisms can advantageously enable a single jewel design to work with different sizes of band mechanisms (for different finger sizes), to enable the replacement of one jewel with another, and to provide opportunities for mix-and-match fashion choices. In addition, the ability to attach different jewels can enable jewels with different capabilities to be connected to the band mechanism. For example, different jewel designs can include different components for different sensing capabilities, larger or smaller batteries, different features, and different price points to enable a user to utilize a jewel most suited to the user's needs.

In some examples, the removable jewel can advantageously allow the jewel to be removed and charged in a separate dock, charging pad, or by using a connector, while the band mechanism remains on the wearer's finger. In other example, the ring input device can be removed from the wearer and charged as a single until. The closed loop configuration of the band mechanism of the ring input device can allow coils to be placed inside the band mechanism, and the ring can be slipped over a cylindrical post on a charging device for inductive charging.

Although various examples and features of the ring input device may have been described above in different paragraphs and shown in different figures for convenience of explanation, it should be understood that different permutations and combinations of these features are contemplated in different examples of the disclosure.

Therefore, according to the above, some examples of the disclosure are directed to a ring input device capable of detecting a press input, the ring input device comprising a band mechanism having an outer band and an inner band, a first pressure-sensitive input mechanism formed on the inner band and disposed between the inner band and the outer band, and an electronic jewel system communicatively couplable to the band mechanism, wherein the first pressure-sensitive input mechanism is configured for providing a first signal to the electronic jewel system for generating a first press input when the first pressure-sensitive input mechanisms is activated. As an alternative to or in addition to one more of the examples disclosed above, in some examples the first pressure-sensitive input mechanism is configured to act as a bearing for the outer band in addition to generating the first press input. As an alternative to or in addition to one more of the examples disclosed above, in some examples the first pressure-sensitive input mechanism is configured to be activated when pressure within a first activation area on the outer band is received. As an alternative to or in addition to one more of the examples disclosed above, in some examples a material of the inner band, at least around the first pressure-sensitive input mechanism, is selected with a particular rigidity to provide the first activation area on the outer band of about 60 degrees on either side of the first pressure-sensitive input mechanism. As an alternative to or in addition to one more of the examples disclosed above, in some examples the first pressure-sensitive input mechanism is a button bearing. As an alternative to or in addition to one more of the examples disclosed above, in some examples the button bearing is a dome switch. As an alternative to or in addition to one more of the examples disclosed above, in some examples a material of the inner band, at least around the first pressure-sensitive input mechanism, is selected with a particular rigidity such that pressure on the outer band at a location offset from the first pressure-sensitive input mechanism causes the inner band to deform and contact the outer band prior to activation of the first pressure-sensitive input mechanism. As an alternative to or in addition to one more of the examples disclosed above, in some examples a material of the inner band, at least around the first pressure-sensitive input mechanism, is selected with a particular rigidity to produce a particular activation area. As an alternative to or in addition to one more of the examples disclosed above, in some examples the ring input device further comprises a plurality of stoppers formed on the inner band on either side of the first pressure-sensing mechanism, the plurality of stoppers configured such that pressure on the outer band at a location offset from the first pressure-sensitive input mechanism causes the outer band to contact one of the stoppers prior to activation of the first pressure-sensitive input mechanism. As an alternative to or in addition to one more of the examples disclosed above, in some examples the ring input device further comprises one or more contact points formed on the inner band and disposed between the inner band and the outer band, the one or more contact points located at areas of the band mechanism insensitive to pressure on the outer band. As an alternative to or in addition to one more of the examples disclosed above, in some examples the ring input device further comprises a second pressure-sensitive input mechanism formed on the inner band and disposed between the inner band and the outer band, wherein the second pressure-sensitive input mechanism is configured for providing a second signal to the electronic jewel system for generating a second press input when the second pressure-sensitive input mechanisms is activated. As an alternative to or in addition to one more of the examples disclosed above, in some examples the outer band is configured to rotate with respect to the inner band, the electronic jewel system is configured for computing a rotational position of the outer band, and the electronic jewel system is configured for initiating an operation based on the first press input and the rotational position of the outer band.

Some examples of the disclosure are directed to a method for detecting a press input on a ring input device, comprising providing a first bearing between an outer band and an inner band of the ring input device for enabling rotation of the outer band with respect to the inner band, and generating a first press input when a first pressure applied on the outer band at the first bearing causes a first pressure threshold at the first bearing to be exceeded. As an alternative to or in addition to one or more of the examples disclosed above, in some examples of the disclosure the method further comprises providing a first activation area on the outer band, wherein the application of the first pressure within the first activation area causes the first pressure threshold at the first bearing to be exceeded, and wherein the application of the first pressure outside the first activation area prevents the first pressure threshold at the first bearing from being exceeded. As an alternative to or in addition to one or more of the examples disclosed above, in some examples of the disclosure the method further comprises selecting a material of the inner band, at least around the first bearing, to have a particular rigidity to provide the first activation area on the outer band of about 60 degrees on either side of the first bearing. As an alternative to or in addition to one or more of the examples disclosed above, in some examples of the disclosure the method further comprises selecting a material of the inner band, at least around the first bearing, to have a particular flexibility such that pressure on the outer band at a location offset from the first bearing causes the inner band to deform and contact the outer band prior to the first pressure threshold at the first bearing being exceeded. As an alternative to or in addition to one or more of the examples disclosed above, in some examples of the disclosure the method further comprises selecting a material of the inner band, at least around the first bearing, with a particular rigidity to produce a particular activation area. As an alternative to or in addition to one or more of the examples disclosed above, in some examples of the disclosure the method further comprises physically stopping the outer band from activating the first bearing when pressure on the outer band is applied at a location offset from the first bearing.

Some examples of the disclosure are directed to a ring input device capable of detecting a press input, comprising bearing means disposed between an outer band and an inner band of the ring input device for enabling rotation of the outer band with respect to the inner band, means for detecting an application of a first pressure on the outer band at the first bearing, and means for generating a first press input when the first pressure exceeds a first pressure threshold at the first bearing. As an alternative to or in addition to one more of the examples disclosed above, in some examples the ring input device further comprising means for physically stopping the outer band from activating the first bearing when pressure on the outer band is applied at a location offset from the first bearing.

Some examples of the disclosure are directed to a ring input device capable of detecting a touch input, the ring input device comprising a band mechanism having a conductive outer band and an inner band, the conductive outer band configured for rotating with respect to the inner band, a first sliding contact formed on the inner band and configured to be in sliding contact with the conductive outer band, and an electronic jewel system communicatively couplable to the band mechanism, wherein the first sliding contact is configured for providing a first touch signal to the electronic jewel system for detecting a first touch input when the conductive outer band is touched. As an alternative to or in addition to one more of the examples disclosed above, in some examples the electronic jewel system is configured for receiving the first touch signal and determining a self-capacitance of the conductive outer band to detect the first touch input. As an alternative to or in addition to one more of the examples disclosed above, in some examples the first sliding contact is a first leaf spring. As an alternative to or in addition to one more of the examples disclosed above, in some examples the first sliding contact is a first button bearing having a first conductive surface configured to be in sliding contact with the conductive outer band. As an alternative to or in addition to one more of the examples disclosed above, in some examples the first sliding contact is a first dome switch having a first conductive surface configured to be in sliding contact with the conductive outer band. As an alternative to or in addition to one more of the examples disclosed above, in some examples the first dome switch comprises a first dome upon which the first conductive surface is formed, the first conductive surface connected to a first touch trace, and a first switch mechanism configured for being activated when sufficient pressure is applied to the first dome, the first switch mechanism connected to a first button trace. As an alternative to or in addition to one more of the examples disclosed above, in some examples the electronic jewel system is configured for receiving the first touch trace to detect a first touch input, and receiving the first button trace to detect a first press input. As an alternative to or in addition to one more of the examples disclosed above, in some examples the first touch trace and the first button trace are connected together to form a first dual-function trace, and wherein the electronic jewel system is configured for using the first dual-function trace to detect a first touch input and a first press input. As an alternative to or in addition to one more of the examples disclosed above, in some examples the electronic jewel system is further configured for determining from the first dual-function trace whether the conductive outer band is being held at a fixed potential, in accordance with a determination that the conductive outer band is not being held at the fixed potential, determining from the dual-function trace a self-capacitance of the conductive outer band, in accordance with a determination that the self-capacitance of the conductive outer band is greater than a predetermined threshold, determining that a valid touch input and no valid press input have been received, and in accordance with a determination that the self-capacitance of the conductive outer band is less than or equal to the predetermined threshold, determining that no valid touch input and no valid press input have been received. As an alternative to or in addition to one more of the examples disclosed above, in some examples the electronic jewel system is further configured for, in accordance with a determination that the conductive outer band is being held at the fixed potential, determining whether a valid press input sequence has been received, in accordance with a determination that a valid press input sequence has been received, determining that a valid press input has been received, and in accordance with a determination that a valid press input sequence has not been received, determining that no valid press input has been received. As an alternative to or in addition to one more of the examples disclosed above, in some examples the ring input device further comprises a second sliding contact formed on the inner band and configured to be in sliding contact with the conductive outer band, wherein the second sliding contact is configured for providing a second touch signal to the electronic jewel system for detecting the first touch input when the conductive outer band is touched. As an alternative to or in addition to one more of the examples disclosed above, in some examples the second sliding contact is a second dome switch having a second conductive surface configured to be in sliding contact with the conductive outer band. As an alternative to or in addition to one more of the examples disclosed above, in some examples the second dome switch comprises a second dome upon which the second conductive surface is formed, the second conductive surface connected to a second touch trace, and a second switch mechanism configured for being activated when sufficient pressure is applied to the second dome, the second switch mechanism connected to a second button trace. As an alternative to or in addition to one more of the examples disclosed above, in some examples the electronic jewel system is configured for receiving the second touch trace to detect the first touch input, and receiving the second button trace to detect a second press input. As an alternative to or in addition to one more of the examples disclosed above, in some examples the second touch trace and the second button trace are connected together to form a second dual-function trace, and the electronic jewel system is configured for using the second dual-function trace to detect the first touch input or a second press input.

Some examples of the disclosure are directed to a method for detecting a touch input on a ring input device, comprising providing a first contact between an inner band and a conductive outer band of the ring input device that maintains sliding electrical contact with the conductive outer band as the outer band rotates with respect to the inner band, and generating a first touch signal on the first contact for detecting a first touch input when the conductive outer band is touched. As an alternative to or in addition to one or more of the examples disclosed above, in some examples of the disclosure the method further comprises using the first contact as a first bearing between the outer band and the inner band in addition to generating the first touch signal. As an alternative to or in addition to one or more of the examples disclosed above, in some examples of the disclosure the method further comprises receiving a first touch trace from the first bearing to provide the first touch signal for detecting the first touch input, and receiving a first button trace from the first bearing for detecting a first press input. As an alternative to or in addition to one or more of the examples disclosed above, in some examples of the disclosure the method further comprises connecting the first touch trace and the first button trace together to form a first dual-function trace, and using the first dual-function trace to detect a first touch input and a first press input. As an alternative to or in addition to one or more of the examples disclosed above, in some examples of the disclosure the method further comprises determining from the first dual-function trace whether the conductive outer band is being held at a fixed potential, in accordance with a determination that the conductive outer band is not being held at the fixed potential, determining from the dual-function trace a self-capacitance of the conductive outer band, in accordance with a determination that the self-capacitance of the conductive outer band is greater than a predetermined threshold, determining that a valid touch input and no valid press input have been received, and in accordance with a determination that the self-capacitance of the conductive outer band is less than or equal to the predetermined threshold, determining that no valid touch input and no valid press input have been received.

Some examples of the disclosure are directed to a ring input device capable of providing and controlling rotational input, the ring input device comprising a band mechanism having an outer band and an inner band, the outer band capable of rotating with respect to the inner band, a first variable resistance generator formed on one or both of the inner band and the outer band, and an electronic jewel system communicatively couplable to the band mechanism, wherein the electronic jewel system is configured for controlling the first variable resistance generator to modulate a rotational resistance of the outer band with respect to the inner band in accordance with an item being manipulated. As an alternative to or in addition to one more of the examples disclosed above, in some examples the electronic jewel system is further configured to modulate the rotational resistance to produce a feeling of detents in the rotating outer band. As an alternative to or in addition to one more of the examples disclosed above, in some examples the electronic jewel system is further configured for controlling the first variable resistance generator to prevent rotation of the outer band. As an alternative to or in addition to one more of the examples disclosed above, in some examples the electronic jewel system is further configured for controlling the first variable resistance generator to increase the rotational resistance of the outer band at a beginning or an end of a rotational input. As an alternative to or in addition to one more of the examples disclosed above, in some examples the first variable resistance generator is one of an electroactive polymer, a shape memory alloy, an air bladder, and magnetorheological fluid. As an alternative to or in addition to one more of the examples disclosed above, in some examples the item is a parameter. As an alternative to or in addition to one more of the examples disclosed above, in some examples the item is a user interface (UI). As an alternative to or in addition to one more of the examples disclosed above, in some examples the first variable resistance generator is affixed to the outer band and applies the modulated rotational resistance against the inner band. As an alternative to or in addition to one more of the examples disclosed above, in some examples the inner band and outer band are arranged as concentric bands, and the ring input device further comprises a second variable resistance generator disposed between the inner band and the outer band and located on an opposite side of the ring input device in relation to the first variable resistance generator, wherein the electronic jewel system is further configured for controlling the first variable resistance generator and the second variable resistance generator to apply complementary opposing forces within the ring input device. As an alternative to or in addition to one more of the examples disclosed above, in some examples the inner band and outer band are arranged as eccentric bands. As an alternative to or in addition to one more of the examples disclosed above, in some examples the first variable resistance generator is an electromagnetic rotational resistance generator having an array of coils formed on the inner band and an array of magnetic poles formed on the outer band. As an alternative to or in addition to one more of the examples disclosed above, in some examples the electromagnetic rotational resistance generator is affixed to a brake that applies frictional resistance to the outer band when magnetically influenced by the electromagnetic rotational resistance generator. As an alternative to or in addition to one more of the examples disclosed above, in some examples the inner band having a side rail for retaining the outer band and the outer band having a side wall adjacent to the side rail, wherein the first variable resistance generator is formed on the side rail of the inner band, and wherein the electronic jewel system is configured for controlling the first variable resistance generator to modulate the rotational resistance of the side rail of the inner band with respect to the side wall of the outer band.

Some examples of the disclosure are directed to a method of controlling rotational input on a ring input device, comprising providing a first variable resistance between an inner band and a rotating outer band of the ring input device, and controlling the first variable resistance to modulate a rotational resistance of the outer band with respect to the inner band in accordance with an item being manipulated. As an alternative to or in addition to one more of the examples disclosed above, in some examples the method further comprises modulating the rotational resistance to produce a feeling of detents in the rotating outer band. As an alternative to or in addition to one more of the examples disclosed above, in some examples the method further comprises modulating the rotational resistance to prevent rotation of the outer band. As an alternative to or in addition to one more of the examples disclosed above, in some examples the method further comprises modulating the rotational resistance to increase the rotational resistance of the outer band at a beginning or an end of a rotational input. As an alternative to or in addition to one more of the examples disclosed above, in some examples the item is a parameter. As an alternative to or in addition to one more of the examples disclosed above, in some examples the item is a user interface (UI). As an alternative to or in addition to one more of the examples disclosed above, in some examples the first variable resistance is an electromagnetic rotational resistance.

Some examples of the disclosure are directed to a ring input device for generating ring positional information, the ring input device comprising a band mechanism having an outer band and an inner band, the outer band configured for rotating with respect to the inner band, the outer band magnetized to form a single dipole, a magnetometer located proximate to the outer band, the magnetometer configured for measuring a magnetic field strength of the outer band along multiple axes, and an electronic system communicatively couplable to the band mechanism and the magnetometer, wherein the electronic system is configured for computing an absolute angle of rotational position of the outer band from the measured magnetic field strength along the multiple axes. As an alternative to or in addition to one more of the examples disclosed above, in some examples the magnetometer is further configured for capturing multiple measurements of the magnetic field strength of the outer band along the multiple axes over time, and the electronic system further configured for computing an amount and direction of rotation of the outer based from the multiple captured magnetic field strength measurements. As an alternative to or in addition to one more of the examples disclosed above, in some examples the magnetometer is further configured for capturing multiple measurements of the magnetic field strength of the outer band along the multiple axes over time, and the electronic system further configured for computing a velocity of rotation of the outer based from the multiple magnetic field strength measurements. As an alternative to or in addition to one more of the examples disclosed above, in some examples the electronic system further configured for calibrating the computed absolute angle of rotational position of the outer band by applying a predetermined offset value to the computed absolute angle of rotational position. As an alternative to or in addition to one more of the examples disclosed above, in some examples the ring input device further comprises a lookup table containing the predetermined offset value for a plurality of computed absolute angles of rotational position. As an alternative to or in addition to one more of the examples disclosed above, in some examples the magnetometer further configured for measuring the magnetic field strength along a Y axis (Y) and measuring the magnetic field strength along a Z axis (Z), the electronic system further configured for computing the absolute angle of rotational position of the outer band as $\theta=\arctan 2 \ (Y,Z)$. As an alternative to or in addition to one more of the examples disclosed above, in some examples the outer band includes a plurality of evenly spaced physical indicators configured to be sensed by a user to provide a tactile confirmation of the amount and direction of rotation of the outer band. As an alternative to or in addition to one more of the examples disclosed above, in some examples the ring input device further comprises a haptic feedback device communicatively coupled to the electronic system and configured for generating haptic feedback each time the physical indicator is sensed during rotation. As an alternative to or in addition to one more of the examples disclosed above, in some examples the ring input device further comprises a haptic feedback device communicatively coupled to the electronic system and configured for generating haptic feedback each time a particular amount of rotation of the outer band is detected. As an alternative to or in addition to one more of the examples disclosed above, in some examples the ring input device further comprises a inertial measurement unit (IMU) communicatively coupled to the electronic system and configured for generating positional information used to determine an orientation of the ring input device. As an alternative to or in addition to one more of the examples disclosed above, in some examples the electronic system is further configured for generating and wirelessly transmitting a cursor signal for manipulating a cursor based on the determined orientation of the ring input device.

Some examples of the disclosure are directed to a method for determining positional information on a ring input device, comprising magnetizing an outer band of the ring input device to form a single dipole, measuring a magnetic field strength of the outer band rotating with respect to an inner band of the ring input device along multiple axes, and computing an absolute angle of rotational position of the outer band from the measured magnetic field strength along the multiple axes. As an alternative to or in addition to one more of the examples disclosed above, in some examples the method further comprises capturing multiple measurements of the magnetic field strength of the outer band along the multiple axes over time, and computing an amount and direction of rotation of the outer based from the multiple captured magnetic field strength measurements. As an alternative to or in addition to one more of the examples disclosed above, in some examples the method further comprises capturing multiple measurements of the magnetic field strength of the outer band along the multiple axes over time, and computing a velocity of rotation of the outer based from the multiple magnetic field strength measurements. As an alternative to or in addition to one more of the examples disclosed above, in some examples the method further comprises calibrating the computed absolute angle of rotational position of the outer band by applying a predetermined offset value to the computed absolute angle of rotational position. As an alternative to or in addition to one more of the examples disclosed above, in some examples the method further comprises measuring the magnetic field strength along a Y axis (Y) and measuring the magnetic field strength along a Z axis (Z), and computing the absolute angle of rotational position of the outer band as $\theta=\arctan 2 \ (Y,Z)$. As an alternative to or in addition to one more of the examples disclosed above, in some examples the method further comprises providing a tactile confirmation of the amount and direction of rotation of the outer band. As an alternative to or in addition to one more of the examples disclosed above, in some examples the method further comprises generating haptic feedback each time a particular amount of rotation of the outer band is detected. As an alternative to or in addition to one more of the examples disclosed above, in some examples the method further comprises generating positional information used to determine an orientation of the ring input device. As an alternative to or in addition to one more of the examples disclosed above, in some examples the method further comprises generating and wirelessly transmitting a cursor signal for manipulating a cursor based on the determined orientation of the ring input device.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

What is claimed is:

1. A wearable ring input device configured for providing and controlling rotational input, comprising:
    a band mechanism having an outer band and an inner band, the outer band configured to rotate with respect to the inner band;
    a first variable resistance generator formed on one or both of the inner band and the outer band and at least partially disposed between the inner band and the outer band; and
    an electronic jewel system communicatively couplable to the band mechanism;
    wherein the electronic jewel system is configured for controlling the first variable resistance generator to modulate a rotational resistance of the outer band with respect to the inner band in accordance with an item being manipulated.

2. The wearable ring input device of claim 1, the electronic jewel system further configured to modulate the rotational resistance to produce a feeling of detents in rotation of the outer band.

3. The ring wearable input device of claim 1, the electronic jewel system further configured for controlling the first variable resistance generator to prevent rotation of the outer band.

4. The wearable ring input device of claim 1, the electronic jewel system further configured for controlling the first variable resistance generator to increase the rotational resistance of the outer band at a beginning or an end of a rotational input.

5. The wearable ring input device of claim 1, wherein the first variable resistance generator is one of an electroactive polymer, a shape memory alloy, an air bladder, and magnetorheological fluid.

6. The wearable ring input device of claim 1, wherein the item is a parameter.

7. The wearable ring input device of claim 1, wherein the item is a user interface (UI).

8. The wearable ring input device of claim 1, wherein the first variable resistance generator is affixed to the outer band and applies the modulated rotational resistance against the inner band.

9. The wearable ring input device of claim 1, wherein the inner band and outer band are arranged as concentric bands, the ring input device further comprising:
    a second variable resistance generator disposed between the inner band and the outer band and located on an opposite side of the ring input device in relation to the first variable resistance generator;
    wherein the electronic jewel system is further configured for controlling the first variable resistance generator and the second variable resistance generator to apply complementary opposing forces within the ring input device.

10. The wearable ring input device of claim 1, wherein the inner band and outer band are arranged as eccentric bands.

11. The wearable ring input device of claim 1, wherein the first variable resistance generator is an electromagnetic rotational resistance generator having an array of coils formed on the inner band and an array of magnetic poles formed on the outer band.

12. The wearable ring input device of claim 11, wherein the electromagnetic rotational resistance generator is affixed to a brake that applies frictional resistance to the outer band when magnetically influenced by the electromagnetic rotational resistance generator.

13. The wearable ring input device of claim 1, the inner band having a side rail for retaining the outer band and the outer band having a side wall adjacent to the side rail;
    wherein the first variable resistance generator is formed on the side rail of the inner band, and
    wherein the electronic jewel system is configured for controlling the first variable resistance generator to modulate the rotational resistance of the side rail of the inner band with respect to the side wall of the outer band.

14. The wearable ring input device of claim 1, wherein controlling the first variable resistance generator to modulate the rotational resistance of the outer band with respect to the inner band in accordance with the item being manipulated includes:
    controlling the first variable resistance to modulate the rotational resistance of the outer band with respect to the inner band to a first rotational resistance in accordance with the item being manipulated corresponding to a first item; and
    controlling the first variable resistance to modulate the rotational resistance of the outer band with respect to the inner band to a second rotational resistance, different than the first rotation resistance, in accordance with the item being manipulated corresponding to a second item, different than the first item.

15. A method of controlling rotational input on a wearable ring input device including a first variable resistance generator formed on one or both of an inner band and a rotating outer band and at least partially disposed between the inner band and the rotating outer band, comprising:
    providing, using the first variable resistance generator, a first variable resistance between the inner band and the rotating outer band of the wearable ring input device; and
    controlling the first variable resistance to modulate a rotational resistance of the outer band with respect to the inner band in accordance with an item being manipulated.

16. The method of claim 15, further comprising modulating the rotational resistance to produce a feeling of detents in the rotating outer band.

17. The method of claim 15, further comprising modulating the rotational resistance to prevent rotation of the outer band.

18. The method of claim 15, further comprising modulating the rotational resistance to increase the rotational resistance of the outer band at a beginning or an end of a rotational input.

19. The method of claim 15, wherein the item is a parameter.

20. The method of claim 15, wherein the item is a user interface (UI).

* * * * *